US010267830B2

(12) United States Patent
Kashiwagi et al.

(10) Patent No.: US 10,267,830 B2
(45) Date of Patent: Apr. 23, 2019

(54) FACILITY SELECTION SUPPORTING METHOD AND FACILITY SELECTION SUPPORTING DEVICE

(71) Applicant: FUJITSU LIMITED, Kawasaki-shi, Kanagawa (JP)

(72) Inventors: Tetsuya Kashiwagi, Fukuoka (JP); Yuichi Matsufuji, Fukuoka (JP)

(73) Assignee: FUJITSU LIMITED, Kawasaki (JP)

( * ) Notice: Subject to any disclaimer, the term of this patent is extended or adjusted under 35 U.S.C. 154(b) by 808 days.

(21) Appl. No.: 14/496,595

(22) Filed: Sep. 25, 2014

(65) Prior Publication Data
US 2015/0120227 A1 Apr. 30, 2015

(30) Foreign Application Priority Data
Oct. 31, 2013 (JP) .................. 2013-227713

(51) Int. Cl.
*G01R 19/00* (2006.01)
*H02J 3/00* (2006.01)
*H02J 13/00* (2006.01)

(52) U.S. Cl.
CPC ........... *G01R 19/0092* (2013.01); *H02J 3/00* (2013.01); *H02J 3/005* (2013.01); *H02J 13/0017* (2013.01); *H02J 2003/003* (2013.01); *Y02E 60/723* (2013.01); *Y02E 60/7807* (2013.01); *Y04S 10/16* (2013.01); *Y04S 40/12* (2013.01)

(58) Field of Classification Search
CPC .................................................. G01R 19/0092
See application file for complete search history.

(56) References Cited

U.S. PATENT DOCUMENTS

| 6,405,346 | B1 | 6/2002 | Nawa | |
|---|---|---|---|---|
| 2002/0118502 | A1 | 8/2002 | Yabe et al. | |
| 2012/0303170 | A1 | 11/2012 | Tomita et al. | |
| 2014/0203639 | A1* | 7/2014 | Rozman | H02J 1/00 307/28 |
| 2014/0375126 | A1* | 12/2014 | Kitagishi | G06Q 30/06 307/29 |

FOREIGN PATENT DOCUMENTS

| JP | 5-233742 A | 9/1993 |
|---|---|---|
| JP | 7-163051 A | 6/1995 |
| JP | 2000-349161 A | 12/2000 |
| JP | 2002-261594 A | 9/2002 |
| JP | 2003-79071 A | 3/2003 |

(Continued)

OTHER PUBLICATIONS

Japanese Office Action dated Feb. 28, 2017 for corresponding Japanese Patent Application No. 2013-227713, with Partial English Translation, 5 pages.

(Continued)

*Primary Examiner* — John E Breene
*Assistant Examiner* — Jeffrey C Morgan
(74) *Attorney, Agent, or Firm* — Fujitsu Patent Center

(57) ABSTRACT

A facility selection supporting device calculates a total current value of consumers located in and after a certain power supply section on the way from a distribution substation to a particular consumer and outputs a recommended distribution facility for the power supply section based on the calculated total current value.

10 Claims, 22 Drawing Sheets

(56) References Cited

FOREIGN PATENT DOCUMENTS

| JP | 2004-164162 A | 6/2004 |
| JP | 2005-237130 A | 9/2005 |
| JP | 2010-213542   | 9/2010 |
| JP | 2012-023946   | 2/2012 |
| JP | 2012-147575   | 8/2012 |
| JP | 2012-196046 A | 10/2012 |

OTHER PUBLICATIONS

Japanese Office Action dated Oct. 3, 2017 for corresponding Japanese Patent Application No. 2013-227713, with English Translation, 6 pages.

Japanese Office Action dated Jun. 5, 2018 for corresponding Japanese Patent Application No. 2013-227713, with English Translation, 8 pages.

\* cited by examiner

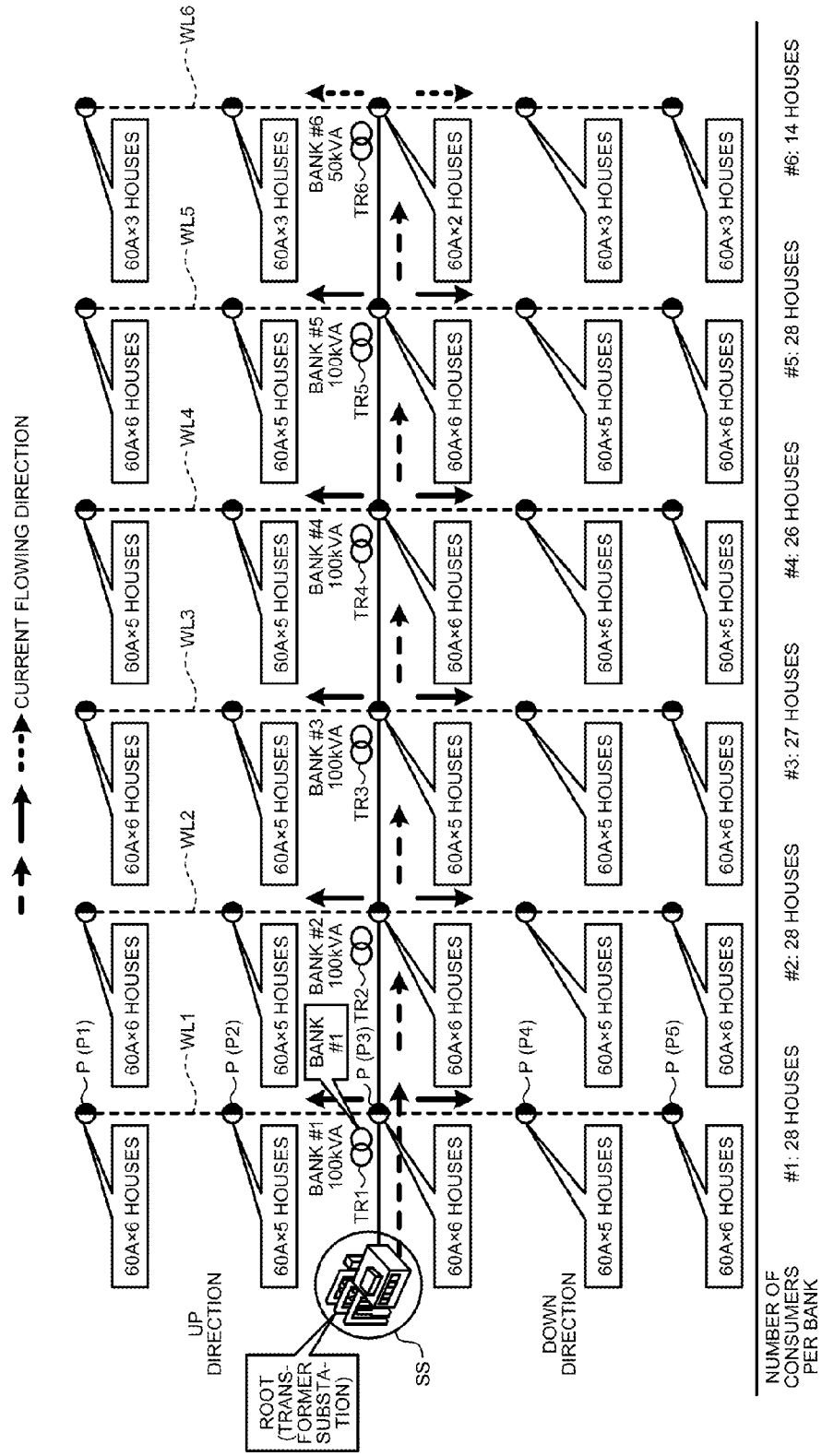

FIG.6

| ARTICLE | SPECIFICATION | | ALLOWABLE CURRENT [A] |
|---|---|---|---|
| | IRON CORE | CAPACITY [kVA] | |
| TR-0030 | STEEL SHEET | 30 | 228 |
| TR-0050 | STEEL SHEET | 50 | 380 |
| TR-0100 | AMORPHOUS | 100 | 762 |
| TR-0150 | AMORPHOUS | 150 | 1142 |

FIG.7

| ARTICLE | SPECIFICATION | | | ALLOWABLE CURRENT [A] |
|---|---|---|---|---|
| | CORE WIRE | COVERING | SIZE [mm$^2$] | |
| LL-01025 | STEEL CORE ALUMINUM STRANDED WIRE | POLYETHYLENE INSULATED WIRE | 25 | 85 |
| LL-01058 | STEEL CORE ALUMINUM STRANDED WIRE | POLYETHYLENE INSULATED WIRE | 58 | 135 |
| LL-01120 | STEEL CORE ALUMINUM STRANDED WIRE | POLYETHYLENE INSULATED WIRE | 120 | 195 |
| LL-02150 | HARD DRAWN COPPER STRANDED CONDUCTOR | CROSS-LINKED POLYETHYLENE INSULATED WIRE | 150 | 225 |
| LL-02200 | HARD DRAWN COPPER STRANDED CONDUCTOR | CROSS-LINKED POLYETHYLENE INSULATED WIRE | 200 | 260 |

FIG.8

| ARTICLE | SPECIFICATION | | | ALLOWABLE CURRENT [A] |
|---|---|---|---|---|
| | CORE WIRE | COVERING | SIZE [*] | |
| SL-01020 | SINGLE WIRE | POLYVINYL CHLORIDE INSULATED WIRE FOR LEADING-IN | 2 | 25 |
| SL-01026 | SINGLE WIRE | POLYVINYL CHLORIDE INSULATED WIRE FOR LEADING-IN | 2.6 | 34 |
| SL-01032 | SINGLE WIRE | POLYVINYL CHLORIDE INSULATED WIRE FOR LEADING-IN | 3.2 | 44 |
| SL-02022 | STRANDED WIRE | POLYVINYL CHLORIDE INSULATED WIRE FOR LEADING-IN | 22 | 80 |
| SL-02038 | STRANDED WIRE | POLYVINYL CHLORIDE INSULATED WIRE FOR LEADING-IN | 38 | 113 |

* SINGLE WIRE: mm (DIAMETER), STRANDED WIRE: $mm^2$ (AREA)

FIG.12

| | ARTICLE | PEAK LOAD CURRENT [A] | OFF-PEAK LOAD CURRENT [A] | | SELECTED ARTICLE |
|---|---|---|---|---|---|
| BANK #1 | TR-0100 | 444.3 | 97.0 | | TR-0100 |
| BANK #2 | TR-0100 | 578.0 | 72.3 | | TR-0100 |
| BANK #3 | TR-0100 | 501.5 | 87.1 | | TR-0100 |
| BANK #4 | TR-0100 | 470.7 | 95.2 | | TR-0100 |
| BANK #5 | TR-0100 | 494.0 | 87.2 | REVERSE | TR-0100 |
| BANK #6 | TR-0050 | 284.7 | 480.0 | POWER FLOW | TR-0100 |

FIG.13

| | | PHASE | ARTICLE | PEAK LOAD CURRENT [A] | OFF-PEAK LOAD CURRENT [A] | | SELECTED ARTICLE |
|---|---|---|---|---|---|---|---|
| BANK #1 | UPWARD LOW-VOLTAGE LINES 1 | n | LL-01058 | 39.6 | 5.0 | EXCESSIVE CAPACITY | LL-01025 |
| | | s/t | LL-01120 | 140.8 | 19.1 | | LL-01120 |
| | UPWARD LOW-VOLTAGE LINES 2 | n | LL-01058 | 21.8 | 2.5 | | LL-01025 |
| | | s/t | LL-01120 | 76.3 | 9.5 | | LL-01025 |
| | DOWNWARD LOW-VOLTAGE LINES 3 | n | LL-01058 | 25.2 | 6.4 | | LL-01025 |
| | | s/t | LL-01120 | 91.9 | 24.3 | | LL-01058 |
| | DOWNWARD LOW-VOLTAGE LINES 4 | n | LL-01058 | 13.7 | 1.6 | | LL-01025 |
| | | s/t | LL-01120 | 49.5 | 6.2 | | LL-01025 |
| BANK #2 | UPWARD LOW-VOLTAGE LINES 1 | n | LL-01058 | 31.5 | 4.5 | | LL-01025 |
| | | s/t | LL-01120 | 114.1 | 17.2 | | LL-01058 |
| | UPWARD LOW-VOLTAGE LINES 2 | n | LL-01058 | 18.9 | 2.2 | | LL-01025 |
| | | s/t | LL-01120 | 67.6 | 8.4 | | LL-01025 |
| | DOWNWARD LOW-VOLTAGE LINES 3 | n | LL-01058 | 53.0 | 4.5 | | LL-01025 |
| | | s/t | LL-01120 | 184.2 | 17.3 | | LL-01120 |
| | DOWNWARD LOW-VOLTAGE LINES 4 | n | LL-01058 | 31.0 | 2.4 | EXCESSIVE CAPACITY | LL-01025 |
| | | s/t | LL-01120 | 105.3 | 9.2 | | LL-01058 |
| BANK #3 | UPWARD LOW-VOLTAGE LINES 1 | n | LL-01058 | 39.6 | 7.0 | | LL-01025 |
| | | s/t | LL-01120 | 139.4 | 26.4 | | LL-01120 |
| | UPWARD LOW-VOLTAGE LINES 2 | n | LL-01058 | 26.5 | 1.6 | | LL-01025 |
| | | s/t | LL-01120 | 92.5 | 5.9 | | LL-01058 |
| | DOWNWARD LOW-VOLTAGE LINES 3 | n | LL-01058 | 30.3 | 4.5 | | LL-01025 |
| | | s/t | LL-01120 | 109.4 | 17.1 | | LL-01058 |
| | DOWNWARD LOW-VOLTAGE LINES 4 | n | LL-01058 | 18.5 | 2.1 | | LL-01025 |
| | | s/t | LL-01120 | 66.2 | 7.8 | | LL-01025 |
| BANK #4 | UPWARD LOW-VOLTAGE LINES 1 | n | LL-01058 | 33.6 | 2.6 | | LL-01025 |
| | | s/t | LL-01120 | 120.8 | 9.9 | | LL-01058 |
| | UPWARD LOW-VOLTAGE LINES 2 | n | LL-01058 | 11.6 | 1.6 | | LL-01025 |
| | | s/t | LL-01120 | 41.9 | 6.0 | | LL-01025 |
| | DOWNWARD LOW-VOLTAGE LINES 3 | n | LL-01058 | 33.9 | 7.2 | EXCESSIVE CAPACITY | LL-01025 |
| | | s/t | LL-01120 | 122.0 | 27.3 | | LL-01058 |
| | DOWNWARD LOW-VOLTAGE LINES 4 | n | LL-01058 | 16.9 | 3.5 | | LL-01025 |
| | | s/t | LL-01120 | 60.2 | 13.1 | | LL-01025 |
| BANK #5 | UPWARD LOW-VOLTAGE LINES 1 | n | LL-01058 | 32.6 | 6.0 | | LL-01025 |
| | | s/t | LL-01120 | 117.4 | 22.9 | | LL-01058 |
| | UPWARD LOW-VOLTAGE LINES 2 | n | LL-01058 | 16.5 | 2.9 | | LL-01025 |
| | | s/t | LL-01120 | 59.2 | 10.8 | | LL-01025 |
| | DOWNWARD LOW-VOLTAGE LINES 3 | n | LL-01058 | 35.5 | 4.9 | | LL-01025 |
| | | s/t | LL-01120 | 127.2 | 18.6 | | LL-01058 |
| | DOWNWARD LOW-VOLTAGE LINES 4 | n | LL-01058 | 20.4 | 3.1 | | LL-01025 |
| | | s/t | LL-01120 | 72.7 | 11.7 | | LL-01025 |
| BANK #6 | UPWARD LOW-VOLTAGE LINES 1 | n | LL-01025 | 18.9 | 15.4 | | LL-01025 |
| | | s/t | LL-01025 | 67.9 | 59.1 | | LL-01025 |
| | UPWARD LOW-VOLTAGE LINES 2 | n | LL-01025 | 11.5 | 30.8 | REVERSE POWER FLOW | LL-01025 |
| | | s/t | LL-01025 | 40.8 | 118.2 | REVERSE POWER FLOW | LL-01058 |
| | DOWNWARD LOW-VOLTAGE LINES 3 | n | LL-01025 | 22.9 | 30.8 | REVERSE POWER FLOW | LL-01025 |
| | | s/t | LL-01025 | 81.0 | 118.2 | REVERSE POWER FLOW | LL-01058 |
| | DOWNWARD LOW-VOLTAGE LINES 4 | n | LL-01025 | 12.1 | 15.4 | REVERSE POWER FLOW | LL-01025 |
| | | s/t | LL-01025 | 42.3 | 59.1 | REVERSE POWER FLOW | LL-01025 |

FIG.14A

| | | PHASE | ARTICLE | PEAK LOAD CURRENT [A] | OFF-PEAK LOAD CURRENT [A] | | SELECTED ARTICLE |
|---|---|---|---|---|---|---|---|
| BANK #1 | CONSUMERS UNDER BANK #1 | s/t | SL-01026 | 17.3 | 0.7 | | SL-01020 |
| | | s/t | SL-01026 | 9.3 | 1.2 | | SL-01020 |
| | | s/t | SL-01026 | 18.0 | 0.5 | | SL-01020 |
| | | s/t | SL-01026 | 13.7 | 0.6 | | SL-01020 |
| | | s/t | SL-01026 | 14.9 | 1.8 | | SL-01020 |
| | | s/t | SL-01026 | 16.6 | 2.0 | | SL-01020 |
| | CONSUMERS UNDER UPWARD POLE 1 | s/t | SL-01026 | 18.4 | 3.5 | | SL-01020 |
| | | s/t | SL-01026 | 17.5 | 0.5 | | SL-01020 |
| | | s/t | SL-01026 | 13.8 | 1.2 | EXCESSIVE CAPACITY | SL-01020 |
| | | s/t | SL-01026 | 7.3 | 1.8 | | SL-01020 |
| | | s/t | SL-01026 | 19.3 | 0.8 | | SL-01020 |
| | CONSUMERS UNDER UPWARD POLE 2 | s/t | SL-01026 | 18.9 | 1.4 | | SL-01020 |
| | | s/t | SL-01026 | 10.7 | 0.8 | | SL-01020 |
| | | s/t | SL-01026 | 17.8 | 1.8 | | SL-01020 |
| | | s/t | SL-01026 | 24.1 | 0.6 | | SL-01020 |
| | | s/t | SL-01026 | 10.6 | 1.2 | | SL-01020 |
| | | s/t | SL-01026 | 17.5 | 1.0 | | SL-01020 |
| | CONSUMERS UNDER DOWNWARD POLE 3 | s/t | SL-01026 | 22.2 | 1.3 | | SL-01020 |
| | | s/t | SL-01026 | 10.8 | 0.6 | | SL-01020 |
| | | s/t | SL-01026 | 26.6 | 1.1 | | SL-01026 |
| | | s/t | SL-01026 | 11.8 | 1.2 | | SL-01020 |
| | | s/t | SL-01026 | 16.1 | 1.3 | | SL-01020 |
| | CONSUMERS UNDER DOWNWARD POLE 4 | s/t | SL-01026 | 0.8 | 0.2 | | SL-01020 |
| | | s/t | SL-01026 | 7.0 | 0.4 | EXCESSIVE CAPACITY | SL-01020 |
| | | s/t | SL-01026 | 12.5 | 0.2 | | SL-01020 |
| | | s/t | SL-01026 | 17.8 | 1.8 | | SL-01020 |
| | | s/t | SL-01026 | 15.9 | 1.1 | | SL-01020 |
| | | s/t | SL-01026 | 20.1 | 0.8 | | SL-01020 |

FIG.14B

| | | PHASE | ARTICLE | PEAK LOAD CURRENT [A] | OFF-PEAK LOAD CURRENT [A] | | SELECTED ARTICLE |
|---|---|---|---|---|---|---|---|
| BANK #2 | CONSUMERS UNDER BANK #2 | s/t | SL-01026 | 9.1 | 0.9 | EXCESSIVE CAPACITY | SL-01020 |
| | | s/t | SL-01026 | 15.4 | 0.8 | | SL-01020 |
| | | s/t | SL-01026 | 12.5 | 1.6 | | SL-01020 |
| | | s/t | SL-01026 | 11.7 | 0.8 | | SL-01020 |
| | | s/t | SL-01026 | 13.5 | 0.6 | | SL-01020 |
| | | s/t | SL-01026 | 17.5 | 1.5 | | SL-01020 |
| | CONSUMERS UNDER UPWARD POLE 1 | s/t | SL-01026 | 19.8 | 1.9 | EXCESSIVE CAPACITY | SL-01020 |
| | | s/t | SL-01026 | 12.7 | 1.2 | | SL-01020 |
| | | s/t | SL-01026 | 5.6 | 0.9 | | SL-01020 |
| | | s/t | SL-01026 | 19.8 | 1.1 | | SL-01020 |
| | | s/t | SL-01026 | 13.3 | 0.5 | | SL-01020 |
| | CONSUMERS UNDER UPWARD POLE 2 | s/t | SL-01026 | 15.3 | 1.5 | | SL-01020 |
| | | s/t | SL-01026 | 15.6 | 1.1 | | SL-01020 |
| | | s/t | SL-01026 | 18.3 | 1.4 | | SL-01020 |
| | | s/t | SL-01026 | 16.9 | 0.5 | | SL-01020 |
| | | s/t | SL-01026 | 7.0 | 0.5 | | SL-01020 |
| | | s/t | SL-01026 | 16.1 | 3.4 | | SL-01020 |
| | CONSUMERS UNDER DOWNWARD POLE 3 | s/t | SL-01026 | 30.1 | 1.6 | | SL-01026 |
| | | s/t | SL-01026 | 23.3 | 0.7 | EXCESSIVE CAPACITY | SL-01020 |
| | | s/t | SL-01026 | 16.7 | 0.6 | | SL-01020 |
| | | s/t | SL-01026 | 34.1 | 0.5 | INSUFFICIENT CAPACITY | SL-01032 |
| | | s/t | SL-01026 | 22.2 | 3.0 | EXCESSIVE CAPACITY | SL-01020 |
| | CONSUMERS UNDER DOWNWARD POLE 4 | s/t | SL-01026 | 41.2 | 5.6 | INSUFFICIENT CAPACITY | SL-01032 |
| | | s/t | SL-01026 | 16.1 | 0.7 | | SL-01020 |
| | | s/t | SL-01026 | 23.6 | 0.6 | | SL-01020 |
| | | s/t | SL-01026 | 11.8 | 0.9 | EXCESSIVE CAPACITY | SL-01020 |
| | | s/t | SL-01026 | 18.0 | 0.8 | | SL-01020 |
| | | s/t | SL-01026 | 10.5 | 0.5 | | SL-01020 |

FIG.14C

| | | PHASE | ARTICLE | PEAK LOAD CURRENT [A] | OFF-PEAK LOAD CURRENT [A] | | SELECTED ARTICLE |
|---|---|---|---|---|---|---|---|
| BANK #3 | CONSUMERS UNDER BANK #3 | s/t | SL-01026 | 11.1 | 1.7 | EXCESSIVE CAPACITY | SL-01020 |
| | | s/t | SL-01026 | 21.7 | 0.9 | | SL-01020 |
| | | s/t | SL-01026 | 10.6 | 1.2 | | SL-01020 |
| | | s/t | SL-01026 | 28.0 | 1.2 | | SL-01026 |
| | | s/t | SL-01026 | 15.2 | 1.1 | | SL-01020 |
| | CONSUMERS UNDER UPWARD POLE 1 | s/t | SL-01026 | 20.3 | 0.4 | EXCESSIVE CAPACITY | SL-01020 |
| | | s/t | SL-01026 | 22.6 | 2.7 | | SL-01020 |
| | | s/t | SL-01026 | 12.0 | 1.5 | | SL-01020 |
| | | s/t | SL-01026 | 22.0 | 2.1 | | SL-01020 |
| | | s/t | SL-01026 | 0.5 | 0.1 | | SL-01020 |
| | CONSUMERS UNDER UPWARD POLE 2 | s/t | SL-01026 | 17.9 | 0.8 | | SL-01020 |
| | | s/t | SL-01026 | 18.6 | 0.3 | | SL-01020 |
| | | s/t | SL-01026 | 9.6 | 1.5 | | SL-01020 |
| | | s/t | SL-01026 | 15.0 | 1.0 | | SL-01020 |
| | | s/t | SL-01026 | 26.1 | 1.5 | | SL-01026 |
| | CONSUMERS UNDER DOWNWARD POLE 3 | s/t | SL-01026 | 10.7 | 0.3 | | SL-01020 |
| | | s/t | SL-01026 | 19.2 | 1.7 | | SL-01020 |
| | | s/t | SL-01026 | 12.5 | 1.3 | | SL-01020 |
| | | s/t | SL-01026 | 11.1 | 1.7 | | SL-01020 |
| | | s/t | SL-01026 | 16.5 | 0.6 | | SL-01020 |
| | CONSUMERS UNDER DOWNWARD POLE 4 | s/t | SL-01026 | 19.4 | 0.6 | EXCESSIVE CAPACITY | SL-01020 |
| | | s/t | SL-01026 | 13.8 | 1.2 | | SL-01020 |
| | | s/t | SL-01026 | 9.2 | 1.1 | | SL-01020 |
| | | s/t | SL-01026 | 11.8 | 1.3 | | SL-01020 |
| | | s/t | SL-01026 | 15.8 | 1.2 | | SL-01020 |
| | | s/t | SL-01026 | 14.6 | 1.4 | | SL-01020 |
| | | s/t | SL-01026 | 19.4 | 1.1 | | SL-01020 |

FIG.14D

| | | PHASE | ARTICLE | PEAK LOAD CURRENT [A] | OFF-PEAK LOAD CURRENT [A] | | SELECTED ARTICLE |
|---|---|---|---|---|---|---|---|
| BANK #4 | CONSUMERS UNDER BANK #4 | s/t | SL-01026 | 17.5 | 0.5 | EXCESSIVE CAPACITY | SL-01020 |
| | | s/t | SL-01026 | 8.9 | 0.6 | | SL-01020 |
| | | s/t | SL-01026 | 11.8 | 0.5 | | SL-01020 |
| | | s/t | SL-01026 | 6.9 | 1.2 | | SL-01020 |
| | | s/t | SL-01026 | 13.7 | 2.2 | | SL-01020 |
| | CONSUMERS UNDER UPWARD POLE 1 | s/t | SL-01026 | 31.2 | 2.3 | | SL-01026 |
| | | s/t | SL-01026 | 19.6 | 0.4 | EXCESSIVE CAPACITY | SL-01020 |
| | | s/t | SL-01026 | 36.7 | 0.6 | INSUFFICIENT CAPACITY | SL-01032 |
| | | s/t | SL-01026 | 12.9 | 0.4 | | SL-01020 |
| | | s/t | SL-01026 | 5.0 | 1.1 | | SL-01020 |
| | | s/t | SL-01026 | 16.7 | 1.3 | | SL-01020 |
| | CONSUMERS UNDER UPWARD POLE 2 | s/t | SL-01026 | 6.5 | 2.2 | | SL-01020 |
| | | s/t | SL-01026 | 1.2 | 0.2 | | SL-01020 |
| | | s/t | SL-01026 | 17.5 | 0.8 | | SL-01020 |
| | | s/t | SL-01026 | 12.5 | 0.5 | | SL-01020 |
| | | s/t | SL-01026 | 19.9 | 2.1 | | SL-01020 |
| | CONSUMERS UNDER DOWNWARD POLE 3 | s/t | SL-01026 | 14.1 | 0.5 | EXCESSIVE CAPACITY | SL-01020 |
| | | s/t | SL-01026 | 22.4 | 1.2 | | SL-01020 |
| | | s/t | SL-01026 | 18.1 | 4.5 | | SL-01020 |
| | | s/t | SL-01026 | 13.9 | 3.6 | | SL-01020 |
| | | s/t | SL-01026 | 15.4 | 2.3 | | SL-01020 |
| | CONSUMERS UNDER DOWNWARD POLE 4 | s/t | SL-01026 | 18.8 | 0.4 | | SL-01020 |
| | | s/t | SL-01026 | 12.7 | 0.3 | | SL-01020 |
| | | s/t | SL-01026 | 13.3 | 2.2 | | SL-01020 |
| | | s/t | SL-01026 | 19.7 | 1.6 | | SL-01020 |
| | | s/t | SL-01026 | 8.0 | 3.0 | | SL-01020 |

FIG.14E

| | | PHASE | ARTICLE | PEAK LOAD CURRENT [A] | OFF-PEAK LOAD CURRENT [A] | | SELECTED ARTICLE |
|---|---|---|---|---|---|---|---|
| BANK #5 | CONSUMERS UNDER BANK #5 | s/t | SL-01026 | 10.1 | 2.8 | EXCESSIVE CAPACITY | SL-01020 |
| | | s/t | SL-01026 | 13.5 | 1.0 | | SL-01020 |
| | | s/t | SL-01026 | 18.7 | 0.9 | | SL-01020 |
| | | s/t | SL-01026 | 11.9 | 0.9 | | SL-01020 |
| | | s/t | SL-01026 | 21.2 | 1.1 | | SL-01020 |
| | | s/t | SL-01026 | 13.4 | 1.3 | | SL-01020 |
| | CONSUMERS UNDER UPWARD POLE 1 | s/t | SL-01026 | 17.5 | 2.5 | | SL-01020 |
| | | s/t | SL-01026 | 16.0 | 0.9 | | SL-01020 |
| | | s/t | SL-01026 | 17.2 | 0.7 | | SL-01020 |
| | | s/t | SL-01026 | 27.8 | 1.2 | | SL-01026 |
| | CONSUMERS UNDER UPWARD POLE 2 | s/t | SL-01026 | 18.7 | 0.6 | EXCESSIVE CAPACITY | SL-01020 |
| | | s/t | SL-01026 | 8.2 | 0.6 | | SL-01020 |
| | | s/t | SL-01026 | 9.4 | 2.3 | | SL-01020 |
| | | s/t | SL-01026 | 31.8 | 2.0 | | SL-01026 |
| | | s/t | SL-01026 | 15.5 | 0.5 | EXCESSIVE CAPACITY | SL-01020 |
| | | s/t | SL-01026 | 8.4 | 0.7 | | SL-01020 |
| | | s/t | SL-01026 | 16.8 | 0.1 | | SL-01020 |
| | CONSUMERS UNDER DOWNWARD POLE 3 | s/t | SL-01026 | 28.2 | 2.3 | | SL-01026 |
| | | s/t | SL-01026 | 18.2 | 0.9 | | SL-01020 |
| | | s/t | SL-01026 | 9.7 | 0.8 | | SL-01020 |
| | | s/t | SL-01026 | 9.3 | 0.6 | | SL-01020 |
| | | s/t | SL-01026 | 17.8 | 2.1 | | SL-01020 |
| | CONSUMERS UNDER DOWNWARD POLE 4 | s/t | SL-01026 | 12.5 | 2.0 | EXCESSIVE CAPACITY | SL-01020 |
| | | s/t | SL-01026 | 23.8 | 1.9 | | SL-01020 |
| | | s/t | SL-01026 | 14.9 | 0.5 | | SL-01020 |
| | | s/t | SL-01026 | 19.2 | 0.6 | | SL-01020 |
| | | s/t | SL-01026 | 12.2 | 0.3 | | SL-01020 |
| | | s/t | SL-01026 | 18.5 | 2.5 | | SL-01020 |

FIG.14F

| | | PHASE | ARTICLE | PEAK LOAD CURRENT [A] | OFF-PEAK LOAD CURRENT [A] | | SELECTED ARTICLE |
|---|---|---|---|---|---|---|---|
| BANK #6 | CONSUMERS UNDER BANK #6 | s/t | SL-01026 | 32.4 | 68.0 | REVERSE POWER FLOW | SL-02022 |
| | | s/t | SL-01026 | 0.7 | 68.0 | REVERSE POWER FLOW | SL-02022 |
| | CONSUMERS UNDER UPWARD POLE 1 | s/t | SL-01026 | 12.2 | 67.9 | REVERSE POWER FLOW | SL-02022 |
| | | s/t | SL-01026 | 24.0 | 67.9 | REVERSE POWER FLOW | SL-02022 |
| | | s/t | SL-01026 | 17.8 | 67.9 | REVERSE POWER FLOW | SL-02022 |
| | CONSUMERS UNDER UPWARD POLE 2 | s/t | SL-01026 | 18.4 | 67.3 | REVERSE POWER FLOW | SL-02022 |
| | | s/t | SL-01026 | 21.6 | 67.3 | REVERSE POWER FLOW | SL-02022 |
| | | s/t | SL-01026 | 17.1 | 67.3 | REVERSE POWER FLOW | SL-02022 |
| | CONSUMERS UNDER DOWNWARD POLE 3 | s/t | SL-01026 | 27.1 | 68.3 | REVERSE POWER FLOW | SL-02022 |
| | | s/t | SL-01026 | 25.3 | 68.3 | REVERSE POWER FLOW | SL-02022 |
| | | s/t | SL-01026 | 6.7 | 68.3 | REVERSE POWER FLOW | SL-02022 |
| | CONSUMERS UNDER DOWNWARD POLE 4 | s/t | SL-01026 | 8.8 | 67.6 | REVERSE POWER FLOW | SL-02022 |
| | | s/t | SL-01026 | 28.3 | 67.6 | REVERSE POWER FLOW | SL-02022 |
| | | s/t | SL-01026 | 19.0 | 67.6 | REVERSE POWER FLOW | SL-02022 |

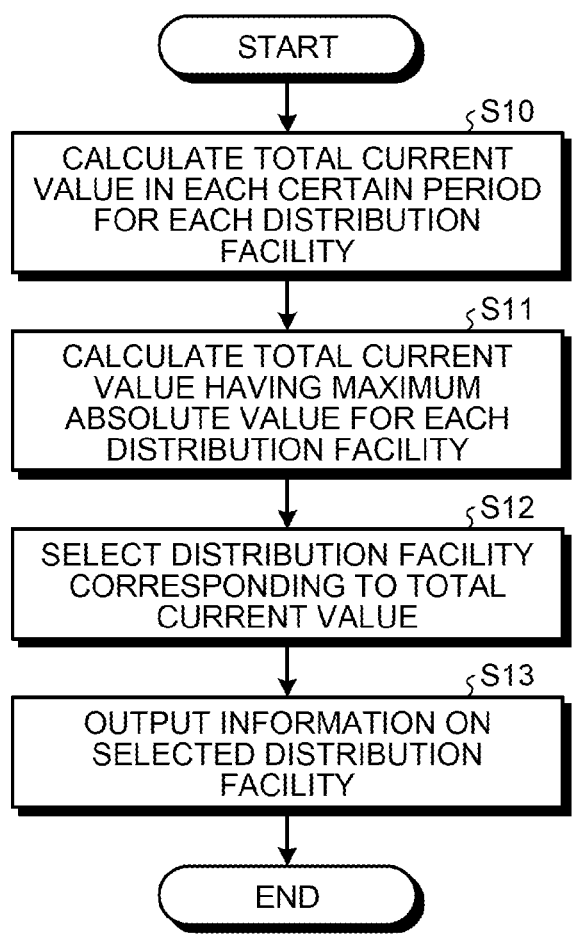

FACILITY SELECTION SUPPORTING METHOD AND FACILITY SELECTION SUPPORTING DEVICE

CROSS-REFERENCE TO RELATED APPLICATIONS

This application is based upon and claims the benefit of priority of the prior Japanese Patent Application No. 2013-227713, filed on Oct. 31, 2013, the entire contents of which are incorporated herein by reference.

FIELD

The embodiments discussed herein are directed to a facility selection supporting program, a facility selection supporting method and a facility selection supporting device.

BACKGROUND

In distribution systems, widely used are distribution facilities whose capacity can withstand the maximum load generated in such distribution systems. Some already-known technologies estimate the maximum load generated in distribution systems. With such conventional technologies, the amount of power consumption in a month is calculated based on the meter-reading information acquired by an electric power company every month and the maximum load is estimated based on the amount of power consumption in a month. Conventional technologies are described in Japanese Laid-open Patent Publication No. 2012-147675, for example.

With the conventional technologies, the maximum load is estimated larger to some extent to prevent a situation in which the maximum load exceeds the capacity of a distribution facility. If the capacity of the distribution facility is selected, therefore, based on the estimated maximum load, the distribution facility with excessive capacity may be selected. In addition, the maximum load may be estimated due to a low-voltage distributed generation system in the distribution line. Furthermore, if the maximum load is not estimated because a reverse power flow occurs, a facility may be selected with a capacity smaller than the actual load.

SUMMARY

According to an aspect of an embodiment, a computer-readable recording medium stores therein a program for causing a computer to execute a process. The process comprises calculating a total current value of consumers located in and after a certain power supply section on the way from a distribution substation to a particular consumer; and outputting a recommended distribution facility for the power supply section based on the calculated total current value.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4 is an exemplary schematic diagram of the relation of connection in the distribution system represented by the distribution system information according to the first embodiment;

FIG. 6 is an example diagram of data organization of transformer specification information according to the first embodiment;

FIG. 7 is an example diagram of data organization of low-voltage line specification information according to the first embodiment;

FIG. 8 is an example diagram of data organization of service line specification information according to the first embodiment;

FIG. 12 is an example diagram of the peak load current and the off-peak load current in pole transformers according to the first embodiment;

FIG. 13 is an example diagram of the peak load current and the off-peak load current in low-voltage lines according to the first embodiment;

FIG. 14A is an example diagram of the peak load current and the off-peak load current in service lines according to the first embodiment;

FIG. 14B is an example diagram of the peak load current and the off-peak load current in service lines according to the first embodiment;

FIG. 14C is an example diagram of the peak load current and the off-peak load current in service lines according to the first embodiment;

FIG. 14D is an example diagram of the peak load current and the off-peak load current in service lines according to the first embodiment;

FIG. 14E is an example diagram of the peak load current and the off-peak load current in service lines according to the first embodiment;

FIG. 14F is an example diagram of the peak load current and the off-peak load current in service lines according to the first embodiment;

FIG. 15 is a flowchart of facility selection support processing according to the first embodiment;

DESCRIPTION OF EMBODIMENTS

Preferred embodiments of the present invention will be explained with reference to accompanying drawings. The embodiments are not intended to limit the disclosed technology. The embodiments may be appropriately combined without contradicting the processing contents.

[a] First Embodiment

Configuration of a facility selection supporting device

Figure 1:
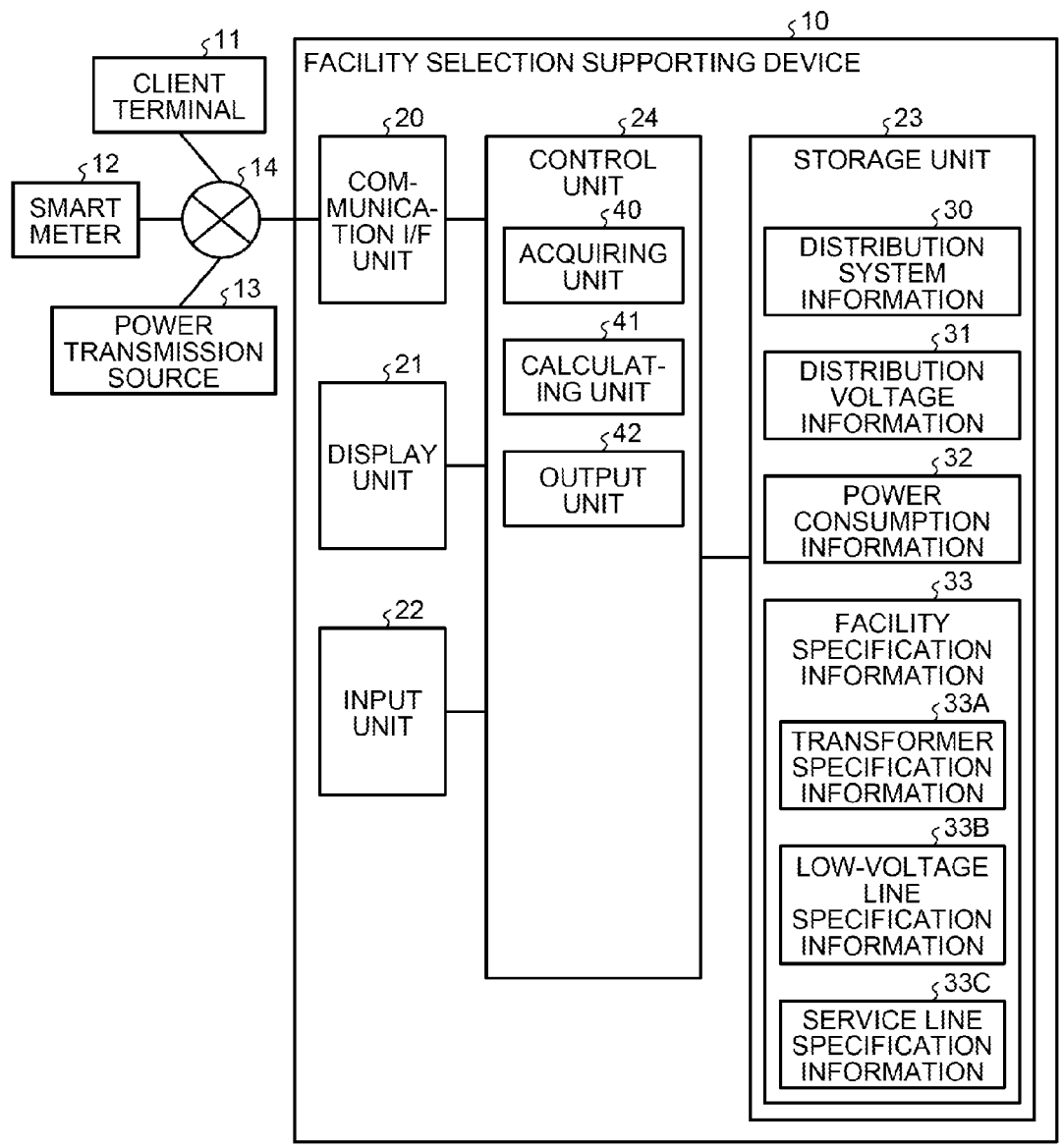
FIG. 1 is a block diagram of the functional configuration of a facility selection supporting device according to a first embodiment of the present invention.

FIG. 1 is a block diagram of a functional configuration of a facility selection supporting device according to a first embodiment of the present invention. A facility selection supporting device 10 illustrated in FIG. 1 executes facility selection support processing to select a distribution facility in a distribution system.

An aspect of the facility selection supporting device 10 may be provided as a Web server that performs the facility selection support processing or a cloud computing that supplies services relating to the facility selection support processing by outsourcing. Another aspect of the facility selection supporting device 10 may be provided by preinstalling or installing a facility selection support processing program supplied as package software or online software on a desired computer.

As illustrated in FIG. 1, the facility selection supporting device 10 is communicably connected to other devices including a client terminal 11, a smart meter 12, and devices provided at a power transmission source 13 via a network 14. Examples of the network 14 include desired types of wired or wireless communication networks, such as the Internet, a local area network (LAN), and a virtual private network (VPN). A desired number of client terminals 11 and smart meters 12 may be connected.

The client terminal 11 is a terminal device used for externally operating the facility selection supporting device 10. Examples of the client terminal 11 include a fixed terminal, such as a personal computer (PC), and a mobile terminal, such as a mobile phone, a personal handy-phone system (PHS), and a personal digital assistant (PDA). The client terminal 11 is used by a member of the electric power supplier, such as a person in charge and an administrator in a distribution department.

The smart meter 12 is an electric power meter with a communication function. The smart meter 12 is connected to a distribution board of the consumer, for example. An aspect of the smart meter 12 measures electric power used by the load facility of the consumer every certain period, specifically, every 30 minutes, for example. The smart meter 12 accumulates and measures the electric power used by the load facility. In the description below, the value of the accumulated and measured electric power used by the load facility may be referred to as "the amount of power consumption". The smart meter 12 measures the current and the voltage of the electric power used in a certain period, for example, every 30 minutes. The smart meter 12 transmits the amount of power consumption, the current value, the voltage value, and the measurement date and time at the measured consumer to the facility selection supporting device 10. The measurement date and time indicates, for example, the date and time when the measurement of the amount of power consumption ends. While the smart meter 12 uploads the amount of power consumption every certain period in this example, the smart meter 12 may upload the amount of power consumption intermittently. The smart meter 12 may upload the amount of power consumption not actively but in response to a request from the facility selection supporting device 10.

The power transmission source 13 is an electric power facility that supplies the electric power to a distribution system. Examples of the power transmission source 13 include a power plant, a distribution substation, and any place along a high-voltage distribution line. In the present embodiment, a later-distribution substation corresponds to the power transmission source 13. A device provided in the power transmission source 13 periodically measures the voltage supplied to the distribution system and the measurement date and time thereof and transmits the information of the measured voltage and the measurement date and time to the facility selection supporting device 10. The device provided in the power transmission source 13 measures the value of the voltage supplied to the distribution system together with the measurement date and time thereof and periodically transmits the value and the measurement date and time to the facility selection supporting device 10, for example. Alternatively, the device provided in the power transmission source 13 may transmit every certain period pieces of information on the voltage supplied to the distribution system measured at times in a certain period. The device provided in the power transmission source 13 may also transmit every certain period the voltage supplied to a distribution system and the measurement date and time thereof to the facility selection supporting device 10, for example, every 30 minutes when the smart meter 12 uploads the amount of power consumption.

The facility selection supporting device 10 includes a communication interface (I/F) unit 20, a display unit 21, an input unit 22, a storage unit 23, and a control unit 24. The facility selection supporting device 10 may include various types of functional units included in a known computer besides the functional units illustrated in FIG. 1.

The communication I/F 20 controls communications with other devices including the client terminal 11, the smart meter 12, and the devices provided at the power transmission source 13, for example. Examples of an aspect of the communication I/F 20 include a network interface card, such as a LAN card. The communication I/F 20, for example, receives various types of information, such as various types of instruction information, from the client terminal 11 and transmits image data of various types of screens from the facility selection supporting device 10 to the client terminal 11.

The display unit 21 is a display device to display various types of information. Examples of the display unit 21 include a display device such as a liquid crystal display (LCD) and a cathode ray tube (CRT). For example, the display unit 21 displays various types of screens such as a investigation target specifying screen and a deteriorated point screen.

The input unit 22 serves as an input device used for inputting various types of information. Examples of the input unit 22 include an input device such as a mouse and a keyboard. The input unit 22 receives an operation input from an administrator who administrates the system and inputs the received operation information that represents the details of the operation input to the control unit 24.

The storage unit 23 serves as a storage device to store therein the operating system (OS) and various types of computer programs executed in the control unit 24 such as a computer program that executes later-described facility selection support processing. Examples of an aspect of the storage unit 23 include a semiconductor memory device, such as a flash memory, and a storage device, such as a hard disk and an optical disc. The storage unit 23 is not limited to the types of storage devices described above and may be a random access memory (RAM).

The storage unit 23 stores therein the data used for the computer program executed in the control unit 24 such as distribution system information 30, distribution voltage information 31, power consumption information 32, and facility specification information 33. The storage unit 23 may also store therein other electronic data besides the information described above.

Figure 2:
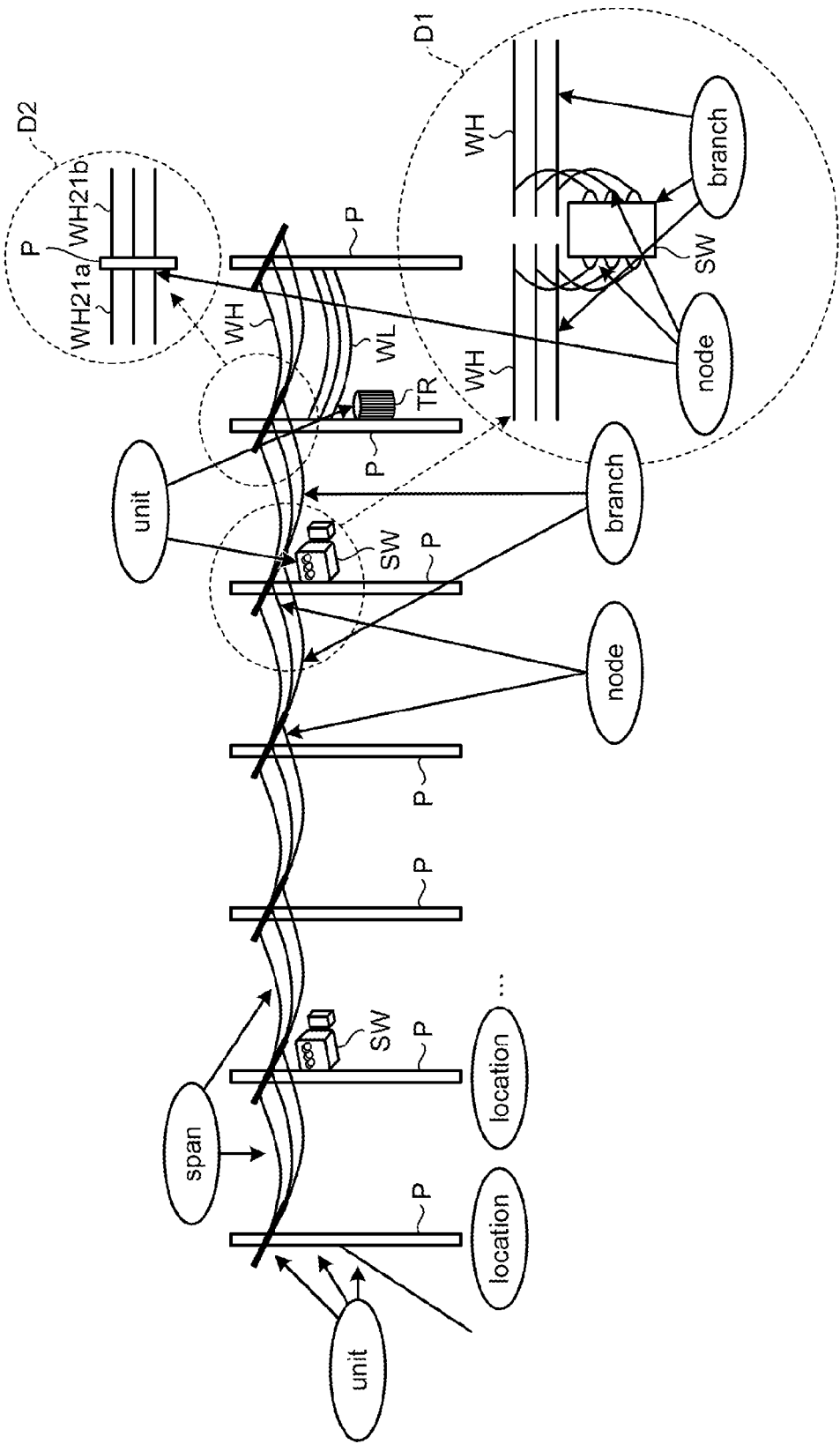
FIG. 2 is an example diagram of a distribution facility included in a distribution system according to the first embodiment.

Examples of the distribution facility in the distribution system include a facility "unit" relating to one position and a facility "span" relating to two positions. FIG. 2 is an example diagram of the distribution facility included in the distribution system. Examples of the unit include the power pole P, a switch SW, and the pole transformer TR. In addition to this, the concept of the unit also includes the distribution substation SS, a step voltage regulator (SVR), various types of meters, such as the smart meter 12, and a manhole and a hand hole provided under the ground, none of which is illustrated.

Examples of the span include an electric wire WH provided to a high-voltage system that transmits high-voltage power between the SS and the pole transformer TR, that is, what is called a "high-voltage line". Examples of the span also include an electric wire WL provided to a section between the pole transformer TR and a service line in a low-voltage system that transmits low-voltage power between the pole transformer TR and the load facility of the consumer, that is, what is called a "low-voltage line". Examples of the span also include an electric wire provided to a section between the service line and the load facility, that is, what is called a "service line". Examples of the span also include a cable buried in the ground. A plurality of (e.g., three or two) electric wires W, such as the high-voltage lines WH and the low-voltage lines WL, provided between the power poles P may be collectively considered as a span.

Referring back to FIG. 1, the distribution system information 30 is data containing information relating to facilities such as a unit and a span in the distribution system. For example, the distribution system information 30 contains information relating to the relation of connection, positions, types, articles, specifications, and attributes of facilities in the distribution system. The distribution system information 30 may consist of a plurality of tables. The distribution system information 30 may also consist of different tables such as a table of information on the relation of connection of facilities, a table of information on the positions of facilities, a table of information on the types, specifications, and attributes of facilities.

Examples of the attributes stored in the distribution system information 30 include, in the case of the span, an article, a thickness, a material, a length, a resistance per unit (m), and a reactance per unit (m) of the span. Examples of the attributes may also include, in the case of the unit, the article and performance of the unit. For example, if the unit serves as a transformer, the attribute may be electrical characteristics such as the capacity and the voltage of a transformer. The attribute information is used for calculating each distribution load in the distribution facility in the distribution system, for example.

The distribution system information 30 includes positional information associated with each distribution facility in the distribution system. For example, the distribution system information 30 contains, in the case of the unit, one piece of positional information associated with the unit and, in the case of the span, two pieces of positional information associated with the span.

In the present embodiment, the relation of connection of distribution facilities in the distribution system are managed by using a connection "node" at which facilities are electrically connected to each other and a facility "branch" determined by a plurality of connections.

Examples of the node include a connection of the high-voltage line WH and the switch SW illustrated in the enlarged view D1 in FIG. 2, a connection of the high-voltage line WH and the pole transformer TR, and a connection of the pole transformer TR and the low-voltage line WL. In addition to this, the concept of the node also includes a point at which a high-voltage line WH21a and a high-voltage line WH21b are connected illustrated in the enlarged view D2 in FIG. 2. Specifically, even when the high-voltage line WH21a and the high-voltage line WH21b are hung by a power pole P serving as a through pole, the high-voltage line WH21a and the high-voltage line WH21b are considered to be electrically connected. A point at which the high-voltage lines WH are connected is considered to be a virtual node.

Examples of the branch include various types of distribution facilities including the power pole P, the high-voltage line WH, the switch SW, the pole transformer TR, and the low-voltage line WL illustrated in FIG. 2. In addition to this, the concept of the branch also includes the SS, the service line, the smart meter 12, and the load facility, none of which is illustrated. Distribution facilities positioned at an end, such as the SS and the load facility, may have one node alone.

Referring back to FIG. 1, the distribution system information 30 contains identifying information of the node and branch of a distribution facility associated with each distribution facility in the distribution system. Tracing the identifying information of the node and branch of a particular distribution facility clarifies the relation of connection of the distribution facility in the distribution system.

Figure 3:
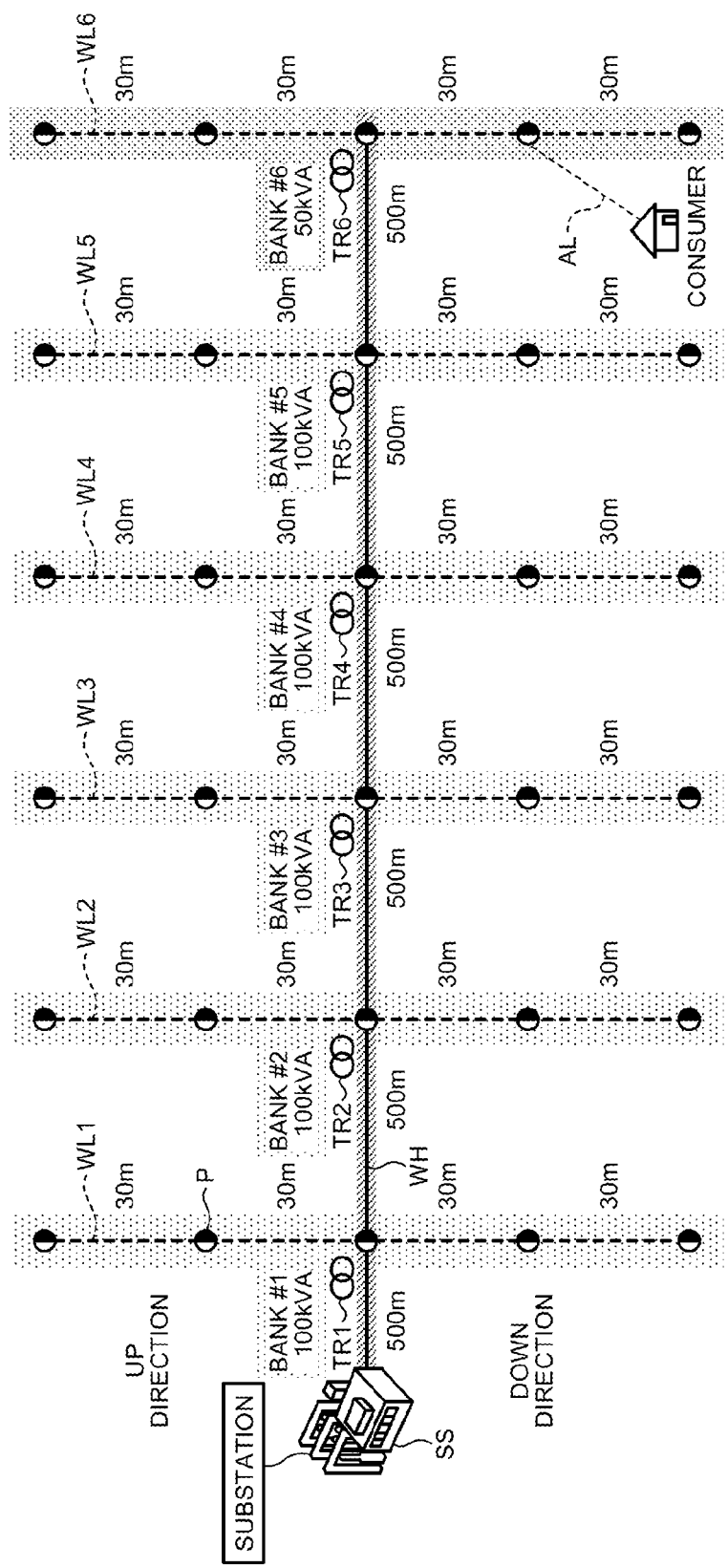
FIG. 3 is an exemplary schematic diagram of the relation of connection in the distribution system represented by distribution system information according to the first embodiment.

FIGS. 3 and 4 are exemplary schematic diagrams of the relation of connection in the distribution system represented by distribution system information. FIG. 3 schematically illustrates the relation of connection among the distribution substation SS, the high-voltage line WH, and six low-voltage lines WL1 to WL6. The high-voltage line WH is connected to the distribution substation SS and the high-voltage power is supplied by a three-phase three-wire scheme using three wires, for example. The high-voltage line WH is provided on the power poles P and connected to the low-voltage lines WL1 to WL6 through the pole transformers TR1 to TR6. The pole transformers TR1 to TR6 are hereinafter also referred to as banks #1 to #6. The pole transformers TR1 to TR6 are connected to the high-voltage line WH and supply low-voltage power acquired by decreasing the high-voltage power by a certain voltage value to the low-voltage lines WL. The low-voltage lines WL may adopt any wiring scheme out of single-phase two-wire, single-phase three-wire, three-phase three-wire, and three-phase four-wire. For example, the pole transformers TR1 to TR6 are connected to two out of the three wires of the high-voltage line WH and supply a low-voltage power acquired by decreasing the high-voltage power by to the low-voltage lines WL. The low-voltage lines WL are also provided on the power poles P and are connected to the service lines at the power poles P, which supplies the electric power to the consumers through the service lines. FIG. 3 illustrates that a service line AL is connected to a low-voltage line WL6 and the electric power is supplied through the service line AL.

FIG. 4 schematically illustrates the relation of connection between the low-voltage lines and the consumers. The consumers are connected to the low-voltage lines WL1 to WL6 through not-illustrated service lines AL, respectively. FIG. 4 illustrates that six houses of consumers having a contract ampere of 60 A are connected to the power pole P1 on the low-voltage line WL1. FIG. 4 also illustrates that five houses of consumers having a contract ampere of 60 A are connected to the power pole P2 on the low-voltage line WL1. FIG. 4 also illustrates that six houses of consumers having a contract ampere of 60 A are connected to the power pole P3 on the low-voltage line WL1. FIG. 4 also illustrates that five houses of consumers having a contract ampere of 60 A are connected to the power pole P4 on the low-voltage line WL1. FIG. 4 also illustrates that six houses of consumers having a contract ampere of 60 A are connected to the power pole P5 on the low-voltage line WL1. FIG. 4 illustrates the number of consumers connected to a transformer (a bank).

Figure 5A:
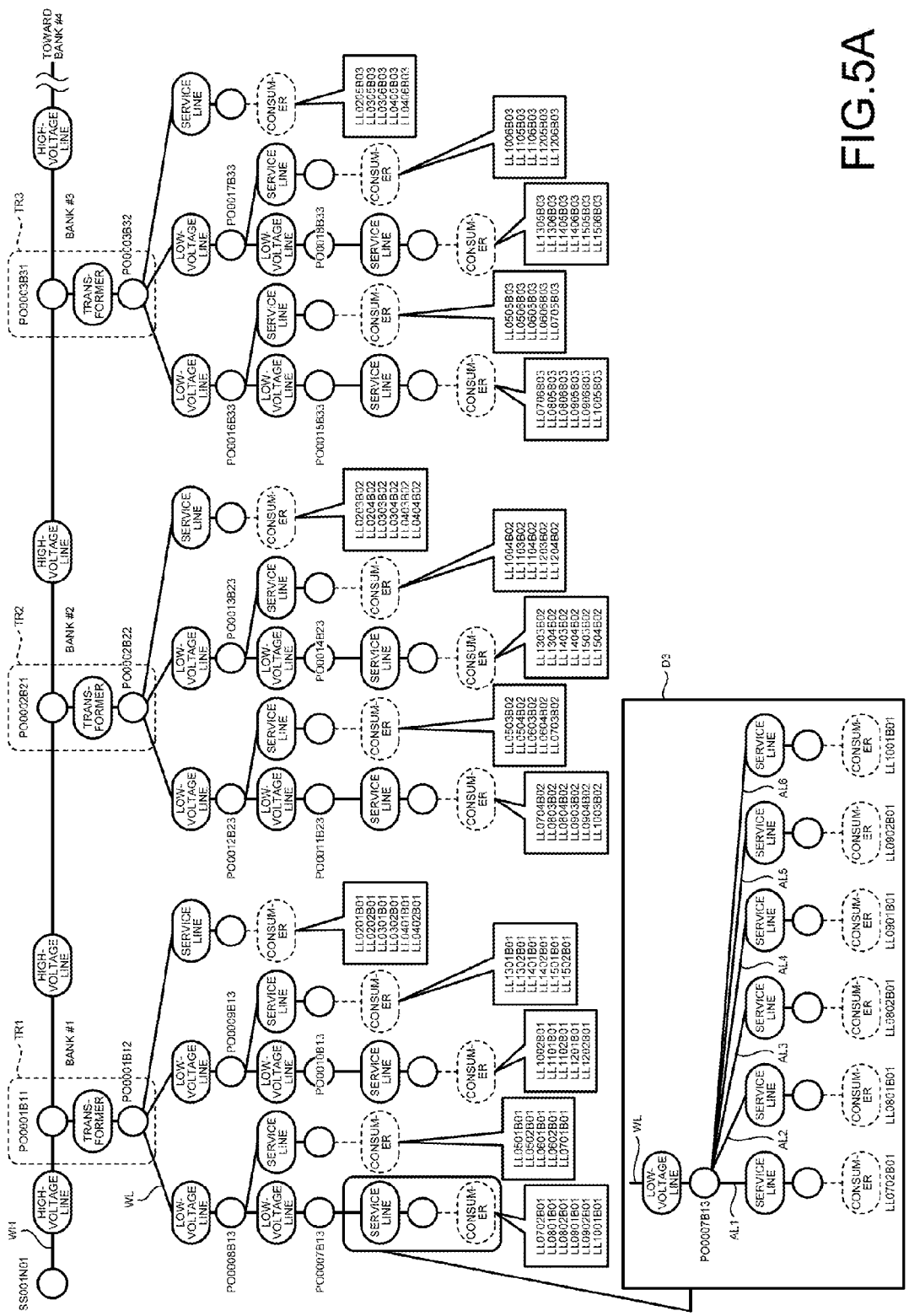
FIG. 5A is a graph structure diagram of the relation of connection in the distribution system according to the first embodiment.
Figure 5B:
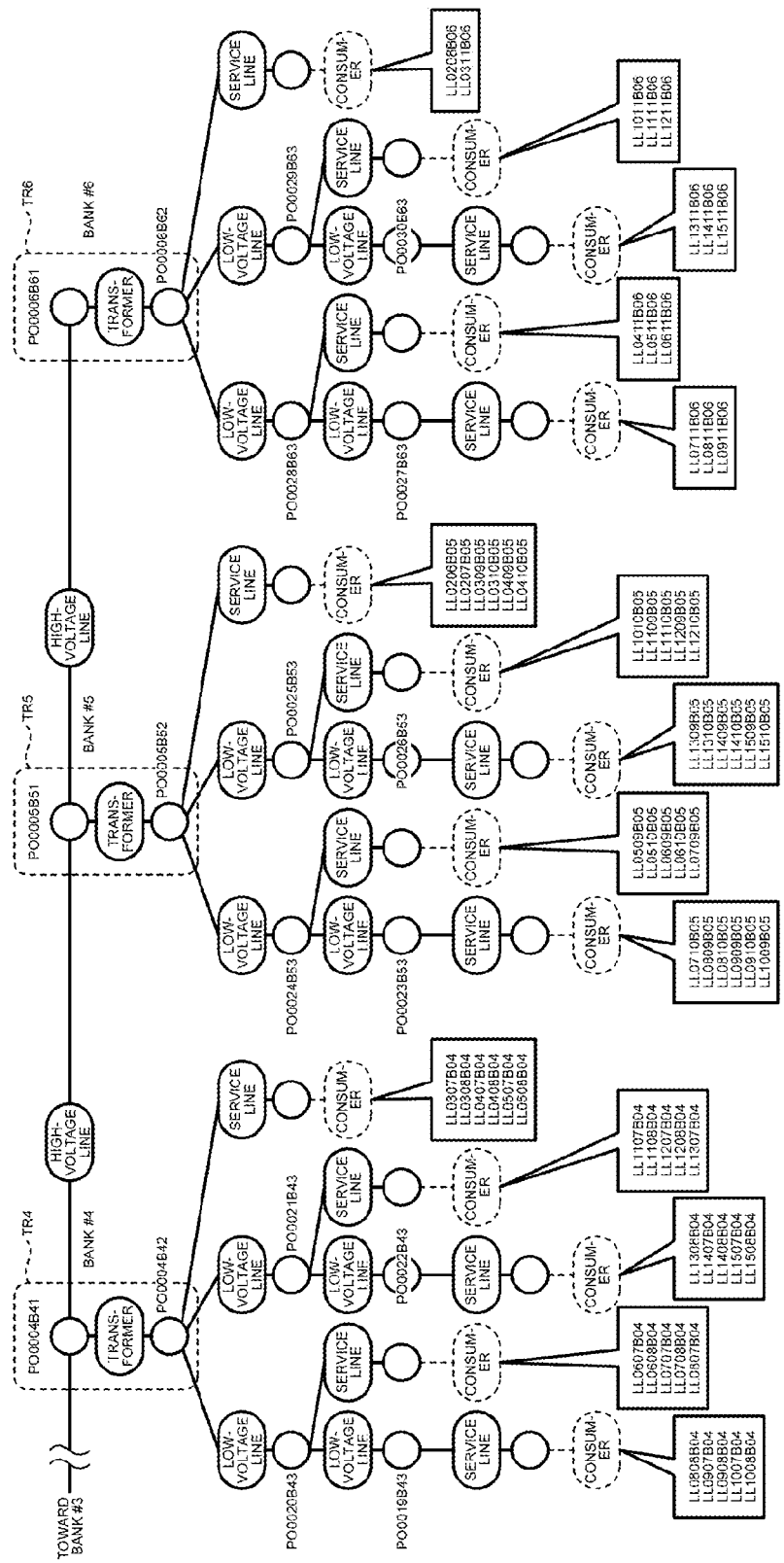
FIG. 5B is a graph structure diagram of the relation of connection in the distribution system according to the first embodiment.

FIGS. 5A and 5B are graph structure diagrams of the relation of connection in the distribution system. FIGS. 5A and 5B illustrate the graph structures of the relation of connection in the distribution system illustrated in FIGS. 3 and 4. FIGS. 5A and 5B illustrate the distribution facilities and their connections, that is, the nodes and branches. FIGS. 5A and 5B also illustrate IDs that is the identifying information provided in association with the nodes and branches. FIGS. 5A and 5B illustrate the IDs of the nodes and branches each have a character string with which the type of the facility can be identified, such as "SS" representing a distribution substation, "PO" representing a power pole, and "LL" representing a consumer, at the head of the character string constituting the ID. For example, the high-voltage line WH is connected to the distribution substation at the node having the ID "SS001N01". The high-voltage line WH is also connected to the pole transformers TR1 to TR6 at the nodes having the IDs "PO0001B11", "PO0002B21", "PO0003B31", "PO0004B41", "PO0005B51", and "PO0006B61", respectively. The pole transformers TR1 to TR6 are connected to the consumers through the low-voltage lines WL. For example, the pole transformer TR1 is connected to the low-voltage line WL at the node having the ID "PO0001B12". As illustrated in the enlarged view D3 in FIG. 5A, the low-voltage line WL is connected to the service lines AL1 to AL6 at the node having the ID "PO0007B13". The service lines AL1 to AL6 are connected to the consumers at the nodes having the IDs "LL0702B01", "LL0801B01", "LL0802B01", "LL0901B01", "LL0902B01", and "LL1001B01", respectively.

Referring back to FIG. 1, the distribution voltage information 31 includes various types of information on the electric power supplied to the distribution system. For example, the distribution voltage information 31 includes the information relating to the voltage and the measurement date and time of the power distribution to the distribution system periodically uploaded by the device provided on the distribution substation SS or the high-voltage distribution line as the power transmission source 13.

The power consumption information 32 is data containing various types of information relating to the electric power received from the smart meter 12 installed at consumers. For example, the power consumption information 32 stores therein the information relating to the amount of power consumption of the consumers, the current value, the voltage value, and the measurement date and time periodically notified by the smart meter 12.

The facility specification information 33 is data containing various types of information relating to the specifications of various types of distribution facilities that can be used in the distribution system. In the present embodiment, the facility specification information 33 contains various types of information relating to the specification of the distribution facilities for each type of facility. In the present embodiment, for example, the facility specification information 33 is categorized into three types of information: transformer specification information 33A, low-voltage line specification information 33B, and service line specification information 33C.

The transformer specification information 33A is data containing various types of information relating to the specification of the transformer that can be used in the distribution system. For example, the transformer specification information 33A contains information relating to the specification of the transformer for each type of the transformer.

FIG. 6 is an example diagram of data organization of the transformer specification information. The transformer specification information 33A includes a table in which items including the article, the specification, and the allowable current are associated with one another, for example. The article item is a field storing the identifying information representing the type of the transformer. The identifying information is determined for each type of the transformer and represents the model of the transformer, for example. The article item stores therein the identifying information representing the type of the transformer. The specification item is a field storing various types of information relating to the specification of the transformer. In the present embodiment, the specification item includes the iron core item and the capacity item. The iron core item is a field storing the type of the member mainly constituting the iron core of the transformer. The capacity item is a field storing the electrical capacity allowed by the transformer. The allowable current item is a field storing the current value allowed by the transformer. The example in FIG. 6 illustrates that the transformer of the article "TR-0030" includes the iron core made of a "steel sheet", a capacity of "30 kVA", and an allowable current of "228 A".

The low-voltage line specification information 33B is data containing various types of information relating to the specification of the wire that can be used in the distribution system as a low-voltage line. For example, the low-voltage line specification information 33B contains information relating to the specification of the wire that can be used in the distribution system for each type of the wire.

FIG. 7 is an example diagram of data organization of the low-voltage line specification information. The low-voltage line specification information 33B includes a table in which items including the article, the specification, and the allowable current are associated with one another, for example. The article item is a field storing the identifying information representing the type of the wire that can be used as a low-voltage line. The identifying information is determined for each type of the wire and represents the model of the wire, for example. The article item stores therein the identifying information representing the type of the wire. The specification item stores therein various types of information relating to the specification of the wire. In the present embodiment, the specification item includes the core wire item, the covering item, and the size item. The core wire item stores therein the type and the structure of the member mainly constituting the conductor in which the current flows existing in the center of the wire. The covering item is a field storing the type and the structure of the member covering the wire. The size item is a field storing information representing the thickness of the core wire. In the present embodiment, the information representing the thickness of the core wire stores therein cross-sectional area of the core wire. Alternatively, the information representing the thickness of the core wire may store therein codes representing the diameter or radius of the cross sectional surface of the core wire, or codes representing the thickness of the core wire. The allowable current item is a field storing the current value allowed by the wire. The example in FIG. 7 illustrates that the wire of the article "LL-01025" includes the core wire made of a "steel core aluminum stranded wire", the covering made of a "polyethylene insulated wire", has a size of "25 mm2" and an allowable current of "85 A".

The service line specification information 33C is data containing various types of information relating to the specification of the wire that can be used in the distribution system as a service line. For example, the service line specification information 33C contains information relating to the specification of the wire that can be used in the distribution system for each type of the wire.

FIG. 8 is an example diagram of data organization of the service line specification information. The service line specification information 33C includes a table in which items including the article, the specification, and the allowable current are associated with one another, for example. The article item is a field storing the identifying information representing the type of the wire that can be used as a service line. The article item stores therein the identifying information representing the type of the wire. The specification item is a field storing various types of information relating to the specification of the wire. In the present embodiment, the specification item includes the core wire item, the covering item, and the size item. The core wire item stores therein the type and the structure of the member mainly constituting the conductor in which the current flows existing in the center of the wire. The covering item is a field storing the type and the structure of the member covering the wire. The size item is a field storing information representing the thickness of the core wire. In the present embodiment, if the core material has a single-wire structure, the size item stores therein the diameter of the core wire. If the core material has a stranded-wire structure, the size item stores therein the cross-sectional area of the core wire. The allowable current item is a field storing the current value allowed by the wire. The example in FIG. 8 illustrates that the wire of the article "SL-01020" includes the core wire made of a "single wire", the covering made of a "polyvinyl chloride insulated wire for leading-in", the size represents a diameter of "2 mm" because the wire is a single wire, and has an allowable current of "25 A".

The control unit 24 includes an internal memory that stores therein a computer program and controls data defining various types of processing procedures and performs various types of processing by using these pieces of data. As illustrated in FIG. 1, the control unit 24 includes an acquiring unit 40, a calculating unit 41, and an output unit 42.

The acquiring unit 40 is a processing unit to acquire various types of information. For example, the acquiring unit 40 acquires the voltage of the high-voltage distribution line led from the distribution substation SS as the voltage information of the distribution system. An aspect of the acquiring unit 40 acquires the voltage and the measurement date and time of a three-wire distribution line in the distribution system updated by the device provided in the high-voltage distribution line led from the distribution substation SS. The measurement date and time may indicate the date and time when the data is uploaded. The acquiring unit 40 additionally registers the acquired voltage and the measurement date and time of the distribution line in the distribution voltage information 31.

For example, the acquiring unit 40 acquires the amount of power consumption, the current value, the voltage value, and the measurement date and time from the smart meter 12. An aspect of the acquiring unit 40 acquires the amount of power consumption and the measurement date and time updated by the smart meter 12 connected to the load facility at each consumer. The measurement date and time may indicate the date and time when the data is uploaded. The acquiring unit 40 additionally registers the facility ID, the amount of power consumption, the current value, the voltage value, and the measurement date and time of the load facility connected to the smart meter 12 in the power consumption information 32. An assumption is made that each smart meter 12 updates the data every certain period, specifically, every 30 minutes, for example. The power consumption information 32 contains the load information on the power consumption facility acquired every certain period. The power consumption information 32, for example, registers therein the data for each smart meter 12 in the cycle of a time corresponding to the sum of an interval of meter-reading that causes the smart meter 12 to transmit the reading result of the amount of power consumption, and a transmission delay time between the power consumption information 32 and the facility selection supporting device 10.

The capacity of various types of distribution facilities used in the distribution system withstands the maximum load (hereinafter, also referred to as a peak load) generated in the distribution system. The load in the distribution system changes over time depending on the amount of power consumed by the load facility at each consumer who tends to temporarily use the power connected to the distribution system. If a consumer is connected to the distribution system, the usual load is moderate and the higher peak load appears when the consumer uses the power. The power generated in widely used low-voltage distributed generation systems, as represented by a home photovoltaic generation system, are partially substituted for the amount of power consumption. This causes the value of the amount of power consumption in a month by a consumer acquired by meter-reading by an electric power company appear smaller than the actual power consumption. This leads to calculating the peak load current smaller than the actual value if the maximum load generated in the distribution system is estimated based on the monthly amount of power consumption, with the conventional technology, for example. This may lead to the determination that the facility having a smaller capacity than the actual load has no problem. For another example, a reverse power flow occurs from a distributed generation system provided in the consumer to the distribution system of an electric power supplier. The electric power flowing bidirectionally, as described above, between the distribution substation and the load facility increases the fluctuation in facilities in low-voltage system due to the reverse power flow generated. Diversified life styles of consumers or diversified load facilities also change the pattern of power consumption. This makes it hard to properly calculate the capacity of various types of distribution facilities used in distribution systems.

Figure 9:
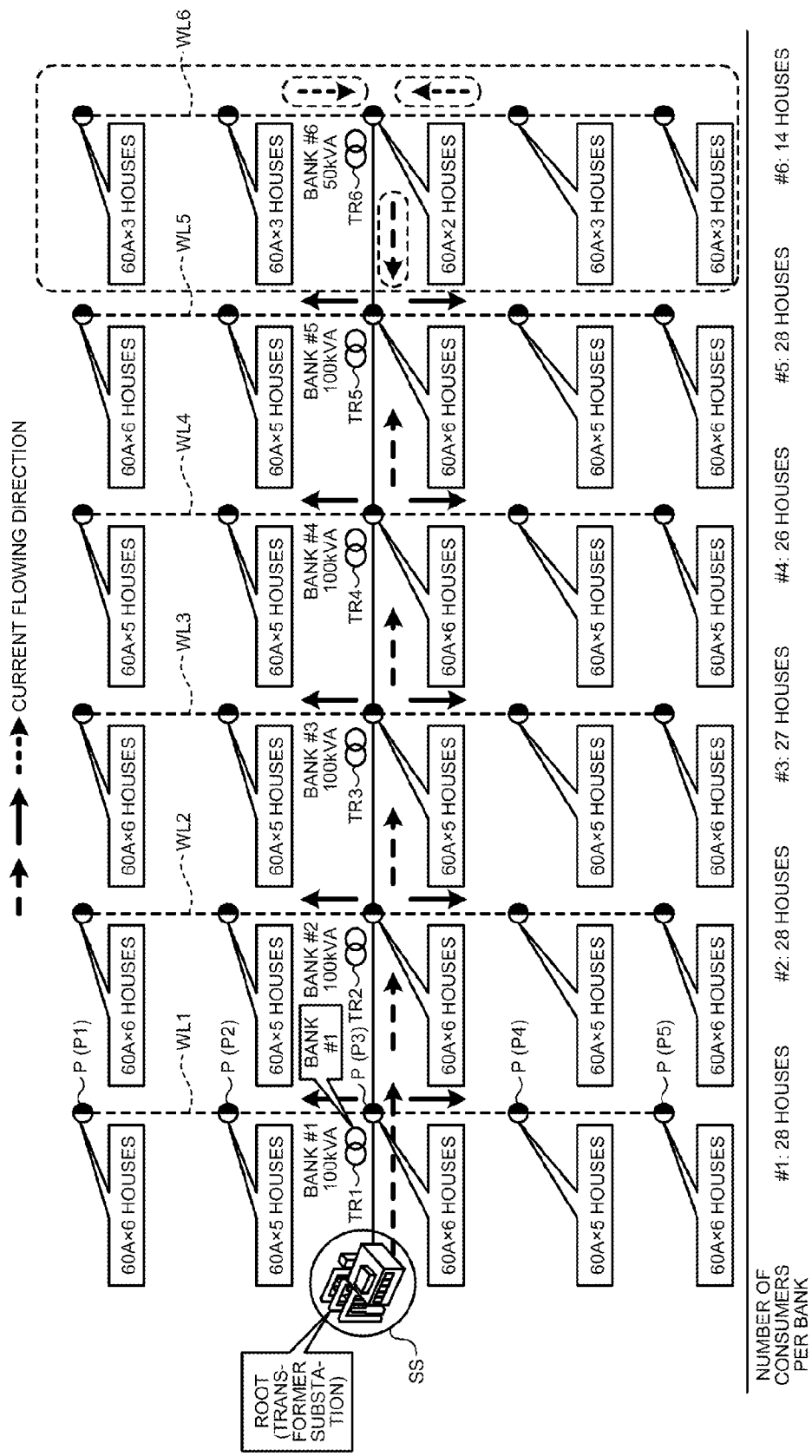
FIG. 9 is an exemplary schematic diagram of the direction in which an electric current flows when a reverse power flow occurs according to the first embodiment.

FIG. 9 is an exemplary schematic diagram of the direction an electric current flows when a reverse power flow occurs. For example, if a distributed generation system is provided at a consumer connected to the bank #6, the reverse power flow may occur from the consumer to the pole transformer TR6 on the low-voltage line WL6, as represented with the arrows. The reverse power flow may occur along the low-voltage line between the banks. The example of FIG. 9 illustrates that the reverse power flow occurs from the pole transformer TR6 to the transformer TR5. As described above, when the reverse power flow occurs in the distribution system, the current flowing from the consumer resulting from a reverse power flow may be larger than the usual current flowing toward the consumer.

The calculating unit 41 calculates the load status in the distribution system. For example, the calculating unit 41 calculates the total current value of the consumers located in and after a certain power supply section on the way from the distribution substation to a particular consumer. The calculated total current value represents the load status of the certain power supply section. In the present embodiment, the smart meter 12 measures the amount of power consumption, the current value, and the voltage value at the consumer every 30 minutes, for example. The data of the measured results at a plurality of time points for each consumer is therefore stored in the power consumption information 32. The calculating unit 41 sums up the current values of the consumers measured time points of which are included in a certain period, for example, 30 minutes and calculates the total current value in each certain period.

More specifically, the calculating unit 41 reads the information used for calculating the load status from the storage unit 23. For example, the calculating unit 41 reads the current values of the consumers measured time points of which are included in a certain period, for example, 30 minutes from the power consumption information 32.

Figure 10:
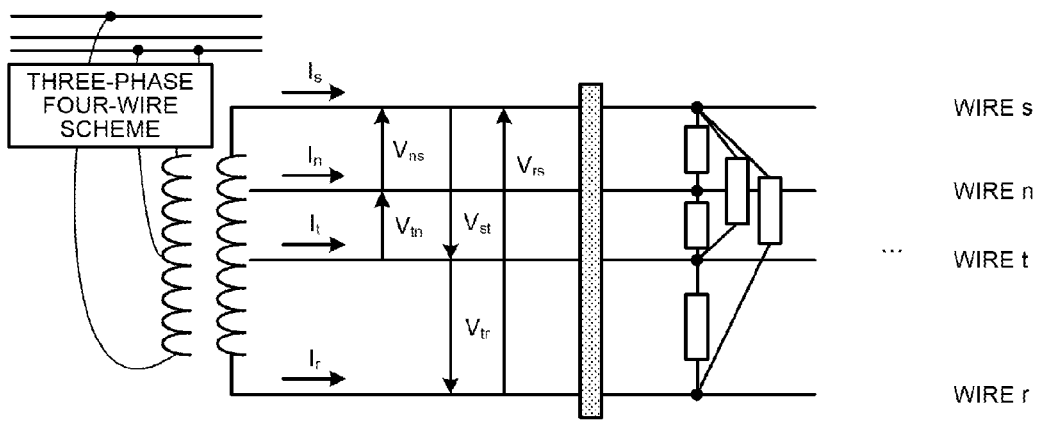
FIG. 10 is a diagram for explaining determination whether the reverse power flow occurs in a three-phase four-wire scheme according to the first embodiment.

The calculating unit 41 determines whether any reverse power flow occurs at a consumer. Any scheme may be used for determining whether a reverse power flow occurs. For example, the determination can be made based on the shift of the phase in the voltage or the current of each low-voltage line WL. Specifically, if the low-voltage line WL has a three-phase four-wire scheme, the direction of the power flow, that is, whether the current flows from the distribution system to the consumer (a forward power flow) or the current flows from the consumer to the distribution system (the reverse power flow), can be determined based on the voltage or the current of each wire. FIG. 10 is a diagram for explaining determination whether the reverse power flow occurs in the three-phase four-wire scheme. For example, the current Is flows through the wire s, the current In flows through the wire n, the current It flows through the wire t, and the current Ir flows through the wire r in the three-phase four-wire scheme. The voltage between the wire s and the wire n is Vns, the voltage between the wire s and the wire t is Vst, the voltage between the wire s and the wire r is Vrs, the voltage between the wire n and the wire t is Vtn, and the voltage between the wire t and the wire r is Vtr. In the following formula, Re ( ) represents the real part of the elements in the bracket. Is* represents the conjugate complex number of the current value in the s-phase and Ir* represents the conjugate complex number of the current value in the r-phase. The following formula can be used for determining whether the reverse power flow occurs. With the formula, the calculation is made assuming that In=0.

$Re(Vst \cdot Is^* - Vtr \cdot r^*) > 0$: the forward power flow $Re(Vst \cdot Is^* - Vtr \cdot r^*) < 0$: the reverse power flow For example, Is is 10 A, the phase is shifted behind by 90 degrees (−90°), and In is 0 A. Is is 10 A, the phase is shifted ahead by 90 degrees (+90°), In is 0 A, and Ir is 0 A. Vns is 100 V and the phase is shifted behind by 60 degrees (−60°). Vtn is 100 V and the phase is shifted behind by 60 degrees (−60°). Vst is 100 V and the phase is shifted behind by 60 degrees (+120°). Vtr is 200 V and the phase is 0 degree (0°). Vrs is 200 V and the phase is 0 degree (0°).

With the conditions above, Vst, Is, and Is* can be calculated as follows:

$$Vst = 200\{\cos(120°) + j \cdot \sin(120°)\} = -100 + j \cdot 100 \cdot (3)1/2$$

$$Is = 10\{\cos(-90°) + j \cdot \sin(-90°)\} = 0 - j \cdot 10 \cdot (3)1/2$$

$$Is^* = 0 + j \cdot 10 \cdot (3)1/2$$

In the same manner, Vtr and Ir* can be calculated as follows:

$$Vtr = 200 + j \cdot 0$$

$$Ir^* = 0 + j \cdot 0$$

The value in the formula used for determining whether a reverse power flow occurs can be calculated as follows:

$$Vst \cdot Is^* - Vtr \cdot Ir^* =$$
$$(-100 + j \cdot 100 \cdot (3)1/2) \cdot (0 + j \cdot 10 \cdot (3)1/2) - (200 + j \cdot 0) \cdot (0 + j \cdot 0) =$$
$$3000 - J \cdot 1000 \cdot (3)1/2$$

$$Re(Vst \cdot Is^* - Vtr \cdot Ir^*) = 3000 > 0$$

As a result, the power flow is determined to be a forward power flow. In the present embodiment, the forward power flow is represented by a positive value and the reverse power flow is represented by a negative value on the basis of the current direction toward a consumer in the distribution system. This is provided merely for exemplary purpose and not limited to this. The presence of the reverse power flow may be determined in a different manner. The presence of the reverse power flow may be determined if the voltage on the downstream side from the connection to a pole transformer TR is higher than the upstream side therefrom in a low-voltage line WL. The presence of the reverse power flow may also be determined if the voltage measured at a particular consumer is higher than the voltage measured on the upstream side from the consumer.

Figure 11:
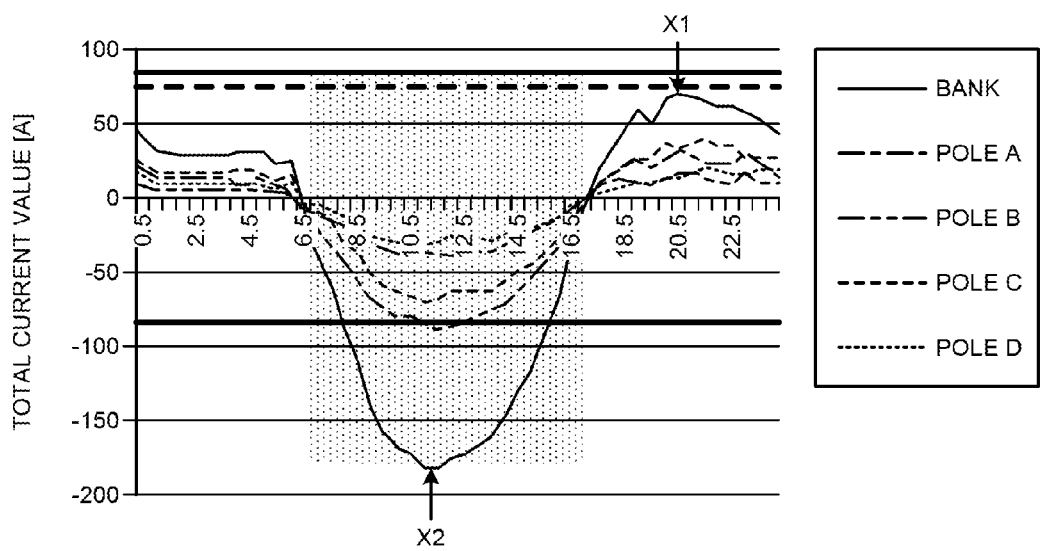
FIG. 11 is an example diagram of a change in a load according to the first embodiment.

The calculating unit 41 sums up the current values of the consumers measured time points of which are included in a certain period, for example, 30 minutes and calculates the total current value in each certain period. The calculated total current value represents the load generated in the distribution facility. FIG. 11 is an example diagram of a change in a load. FIG. 11 is a graph acquired by plotting the calculated total current value for each certain period at the end time point of each certain period. FIG. 11 illustrates an example of a chronological change in the total current value of pole transformers TR when a low-voltage distributed generation system such as a home photovoltaic generation system is provided at a consumer and the total current value of each power pole P on which a low-voltage line WL connected to the pole transformer is provided. If a low-voltage distributed generation system is provided at a consumer, as illustrated in FIG. 11, the total current value is negative due to the reverse power flowing from the consumer from about 7 to 17 o'clock. The peak current value on the negative side may be larger than the peak current value on the positive side.

The calculating unit 41 calculates the total current value in each certain period of the consumers located in and after a particular distribution facility in the distribution system, for each distribution facility in the distribution system.

The output unit 42 performs various types of outputs. The output unit 42 outputs the recommended distribution facility for a particular power supply section, for example. The output unit 42 calculates the total current value having the maximum absolute value out of the total current values calculated every certain period. Specifically, the output unit 42 calculates the total peak current value on the positive side and the total peak current value on the negative side based on each total current value calculated by the calculating unit 41 in each certain period for each distribution facility. The total peak current value on the positive side is hereinafter also referred to as a "peak load current" and the total peak current value on the negative side" is hereinafter also referred to as an "off-peak load current". The example in FIG. 11 illustrates that the arrow X1 indicates a peak load current and the arrow X2 indicates an off-peak load current. The output unit 42 compares the peak load current with the off-peak load current and uses the one having a greater absolute value to output the recommended distribution facility.

FIGS. 12 to 14F illustrate examples of the calculation results of the peak load current and the off-peak load current in the distribution facilities. FIG. 12 is an example diagram of the peak load current and the off-peak load current in the pole transformers. The example in FIG. 12 illustrates the peak load current and the off-peak load current of the banks #1 to #6. The example in FIG. 12 illustrates the articles of the transformers used at the banks #1 to #6.

FIG. 13 is an example diagram of the peak load current and the off-peak load current in low-voltage lines. The example in FIG. 13 illustrates the peak load current and the off-peak load current for the low-voltage lines WL connected to the banks #1 to #6 grouped by power poles P. Referring to FIG. 4, the upward low-voltage lines 1 represents the low-voltage lines WL provided from the banks #1 to #6 to the respective first power poles P in the up direction out of the low-voltage lines WL connected to the banks #1 to #6. Referring to FIG. 4, the upward low-voltage lines 2 represents the low-voltage lines WL provided from the first power poles P to the second first power poles P in the up direction out of the low-voltage lines WL connected to the banks #1 to #6. Referring to FIG. 4, the downward low-voltage lines 3 represents the low-voltage lines WL provided from the banks #1 to #6 to the respective first power poles P in the down direction out of the low-voltage lines WL connected to the banks #1 to #6. Referring to FIG. 4, the downward low-voltage lines 4 represents the low-voltage lines WL provided from the first power poles P to the second power poles P in the down direction out of the low-voltage lines WL connected to the banks #1 to #6. The example in FIG. 13 illustrates the articles of the wires used as low-voltage lines WL. In the present embodiment, the wires used as low-voltage lines WL are grouped into two classes, that is, an n-phase and an s/t-phase. The wire n is used as a low-voltage line WL in the n-phase and the wire s or the wire t is used as a low-voltage line WL in the s/t-phase.

FIGS. 14A to 14F are example diagrams of the peak load current and the off-peak load current in service lines. FIGS. 14A to 14F illustrate the peak load current and the off-peak load current in service lines AL under the banks #1 to #6 grouped by power poles. The examples in FIGS. 14A to 14F illustrate the service lines AL grouped by power poles P to which the service lines AL are connected. The consumers under bank # lists the service lines AL to the consumers connected to the power poles P provided with the banks. Referring to FIG. 4, the consumers under the upward poles 1 lists the service lines AL to the consumers connected to the first power poles P from the banks #1 to #6 in the up direction. Referring to FIG. 4, the consumers under the upward poles 2 lists the service lines AL to the consumers connected to the second power poles P from the banks #1 to #6 in the up direction. Referring to FIG. 4, the consumers under the downward poles 3 lists the service lines AL to the consumers connected to the first power poles P from the banks #1 to #6 in the down direction. Referring to FIG. 4, the consumers under the downward poles 4 lists the service lines AL to the consumers connected to the second power poles P from the banks #1 to #6 in the down direction. The examples in FIGS. 14A to 14F illustrate the articles of the wires used as service lines AL. In the present embodiment, two types of wires, that is, the wire s and the wire t are used as service lines AL. The s/t-phase corresponds to the wire s and the wire t.

The output unit 42 compares the peak load current with the off-peak load current and uses the one having a greater absolute value to output the recommended distribution facility. The output unit 42, for example, compares the peak load current with the off-peak load current and determines the one having a greater value as the maximum load current value. The output unit 42 selects the distribution facility having the allowable current value corresponding to the determined maximum load current value from the facility specification information 33. The output unit 42 selects the distribution facility of the article having the allowable current value equal to or larger than the maximum load current value and having the minimum allowable current value, for example. If the selected distribution facility is different from the distribution facility that is being used, the output unit 42 outputs the selected distribution facility as the recommended distribution facility. The output unit 42 outputs screen information displaying the information relating to the recommended distribution facility to the client terminal 11 and enables the client terminal to display the information on the screen. The output unit 42 may output the maximum load current value for each distribution facility. The output unit 42 may output the information relating to the recommended distribution facility for the distribution facility with an insufficient capacity. That is, the output unit 42 does not necessarily output the information relating to the recommended distribution facility for the distribution facility with an excessive capacity. No problem will occur when not replacing the distribution facility with an excessive capacity. The output unit 42 may therefore output the information relating to the recommended distribution facility only for the distribution facility with an insufficient capacity.

The example in FIG. 12 illustrates that the peak load current is determined to be the maximum load current value in the banks #1 to #5. The off-peak load current is determined to be the maximum load current value in the bank #6. In the bank #6, as illustrated in FIG. 11, the reverse power flow often occurs. The example in FIG. 12 illustrates that the article of the distribution facility selected based on the maximum load current value is listed as a selected article. In the banks #1 to #5, the distribution facility of the article "TR-0100" having an allowable current value of 762 A is selected as the distribution facility having the allowable current value corresponding to the peak load current, that is, the maximum load current value. By contrast, in the bank #6, the distribution facility of the article "TR-0100" having an allowable current value of 762 A is selected as the distribution facility having the allowable current value corresponding to the off-peak load current, that is, the maximum load current value. Because the selected article "TR-0100" is different from the distribution facility of the article "TR-0050" that is being used in the bank #6, the output unit 42 therefore outputs the distribution facility of the article "TR-0100" as the recommended distribution facility. If the distribution facility is provided based on the peak load current, then the bank #6 is provided with the distribution facility of the article "TR-0050" having an allowable current value of 380 A. This makes the bank #6 with the article "TR-0050" have an insufficient capacity because the off-peak load of the bank #6 is 480 A. The distribution facility in the bank #6 is therefore replaced with the recommended distribution facility, thereby preventing the distribution facility from having insufficient capacity.

In addition, the output unit 42 selects the distribution facility having the allowable current value corresponding to the maximum load current value, thereby preventing the distribution facility with an excessive capacity.

The example in FIG. 13 illustrates that "excessive capacity" is noted on the facilities with the capacity excessive for the maximum load current value. "Reverse power flow" is also noted on the facilities having the off-peak load current larger than the peak load current. For the distribution facility with an excessive capacity, a distribution facility with the smaller allowable current value is selected. In the downward low-voltage line 3 in the bank #1, for example, the wire n is the article "LL-01058" having an allowable current value of 135 A and the wire s and the wire t are the article "LL-01120" having an allowable current value of 195 A. The output unit 42 selects the wire of the article "LL-01025" having an allowable current value of 85 A for the wire n and selects the wire of the article "LL-01058" having an allowable current value of 135 A for the wire s and the wire t. The wire n has sufficient capacity if replaced with the wire of the article "LL-01025" having an allowable current value of 85 A. The wire s and the wire t also have sufficient capacities if replaced with the wire of the article "LL-01058" having an allowable current value of 135 A. This enables the output unit 42 to select the distribution facility that matches the load.

For the distribution facility where a reverse power flow occurs, a distribution facility having the allowable current value corresponding to the off-peak load current is selected. For the wire s and the wire t used for the upward low-voltage line 2 in the bank #6, for example, the article "LL-01058" having an allowable current value of 135 A is selected.

The examples in FIGS. 14A to 14F also illustrate that "excessive capacity" is noted on the facilities with the capacity excessive for the maximum load current value, "insufficient capacity" is noted on the facilities with the capacity insufficient for the maximum load current value, and "the reverse power flow" is noted on the facilities having the off-peak load current larger than the peak load current. In the consumers under the bank #1 in FIG. 14A, the distribution facility is determined to be the facility having an excessive capacity, and the article "SL-01020" having an allowable current value of 25 A is selected. For the first customer (the first line) in the consumers under the downward poles 4 in FIG. 14B, the present article "SL-01026" has an allowable current value of 34 A that is insufficient for the peak load. The article "SL-01032" having an allowable current value of 44 A is therefore selected. The service lines listed in the bank #6 in FIG. 14F all have reverse power flows and the service line having the allowable current value corresponding to the off-peak load current is selected.

The output unit 42 compares the peak load current with the off-peak load current and determines the one having a greater absolute value, that is, the total current value having the maximum absolute value as the maximum load current value. Alternatively, the output unit 42 may determine the resultant of adding a margin to the maximum total current value as the maximum load current value. The margin may be a fixed value or a rate such as 10% of the maximum total current value. The margin may be externally set by an administrator, for example.

The output unit 42 selects the distribution facility of the article having the allowable current value equal to or larger than the maximum load current value and having the minimum allowable current value, for example. The output unit 42, however, may select the distribution facility based on other criteria. Information on the cost such as the price of the distribution facilities, for example, is stored in the facility specification information 33. The output unit 42 may select the distribution facility of the article having the maximum load current value equal to or smaller than the allowable current value and the smaller cost as the corresponding distribution facility. The output unit may also select the distribution facility of the article having the maximum load current value equal to or smaller than the allowable current value and a smaller diameter (size) of the distribution wire as the corresponding distribution facility. The cost of a typical wire increases with an increased diameter thereof. This also increases the cost for installation. Selecting a distribution facility having a small diameter by the output unit 42 therefore suppresses the increase of the cost for the distribution facility.

The control unit 24 may be various types of circuits, including integrated circuits and electronic circuits. A part of the functional units included in the control unit 24 may be other integrated circuits or electronic circuits. Examples of the integrated circuits include an application specific integrated circuit (ASIC). Examples of the electronic circuits include a central processing unit (CPU) and a micro processing unit (MPU).

Procedure of Processing

The following describes the procedure of facility selection support processing performed by the facility selection supporting device 10 according to the present embodiment. The facility selection supporting device 10 supports the selection of the distribution facility through the facility selection support processing. FIG. 15 is a flowchart of the facility selection support processing. The facility selection support processing is started at a certain time, specifically, when the client terminal 11 instructs selection of a distribution facility, for example.

As illustrated in FIG. 15, the calculating unit 41 calculates the total current value in each certain period of the consumers located in and after a particular distribution facility in the distribution system, for each distribution facility in the distribution system (Step S10). The output unit 42 calculates the total current value having the maximum absolute value out of the total current values calculated every certain period (Step S11). Specifically, the output unit 42 calculates the peak current value and the peak current value based on each total current value calculated by the calculating unit 41 in each certain period for each distribution facility. The output unit 42 compares the peak load current with the off-peak load current and determines the one having a greater absolute value as the maximum total current value.

The output unit 42 selects the distribution facility having the allowable current value corresponding to the maximum load current value from the facility specification information 33 for each distribution facility in the distribution system (Step S12). If the selected distribution facility is different from the distribution facility that is being used, the output unit 42 outputs the selected distribution facility as the recommended distribution facility. The output unit 42 outputs the screen information displaying the information relating to the recommended distribution facility to the client terminal 11 and enables the client terminal to display the information on the screen.

Advantageous Effects of the First Embodiment

As described above, the facility selection supporting device 10 calculates the total current value of the consumers located in and after a certain power supply section on the way from the distribution substation SS to a particular consumer. The facility selection supporting device 10 outputs the recommended distribution facility for a particular power supply section based on the calculated total current value. This enables the facility selection supporting device 10 to support the selection of the distribution facility that matches the load.

The facility selection supporting device 10 determines distribution facility having the minimum allowable current value, the minimum cost, or the minimum diameter (size) of the distribution wire out of the distribution facilities having the allowable current value exceeding the total current value as the recommended distribution facility. This enables the facility selection supporting device 10 to recommend the distribution facility having the smaller cost, thereby suppressing the increase of the cost for the distribution facility.

The facility selection supporting device 10 determines the distribution facility having the allowable current value equal to or larger than the resultant of adding a margin to the total current value as the recommended distribution facility. This enables the facility selection supporting device 10 to suppress the recommended distribution facility from being unable to correspond to the load if the load generated in the distribution system increases due to a change in the life style of the consumer, for example.

The facility selection supporting device 10 outputs the distribution facility having the allowable current value corresponding to the total current values having the maximum absolute value out of the total current values calculated every certain period. This enables the facility selection supporting device 10 to recommend the distribution facility corresponding to the maximum load actually generated.

[b] Second Embodiment

Figure 16:
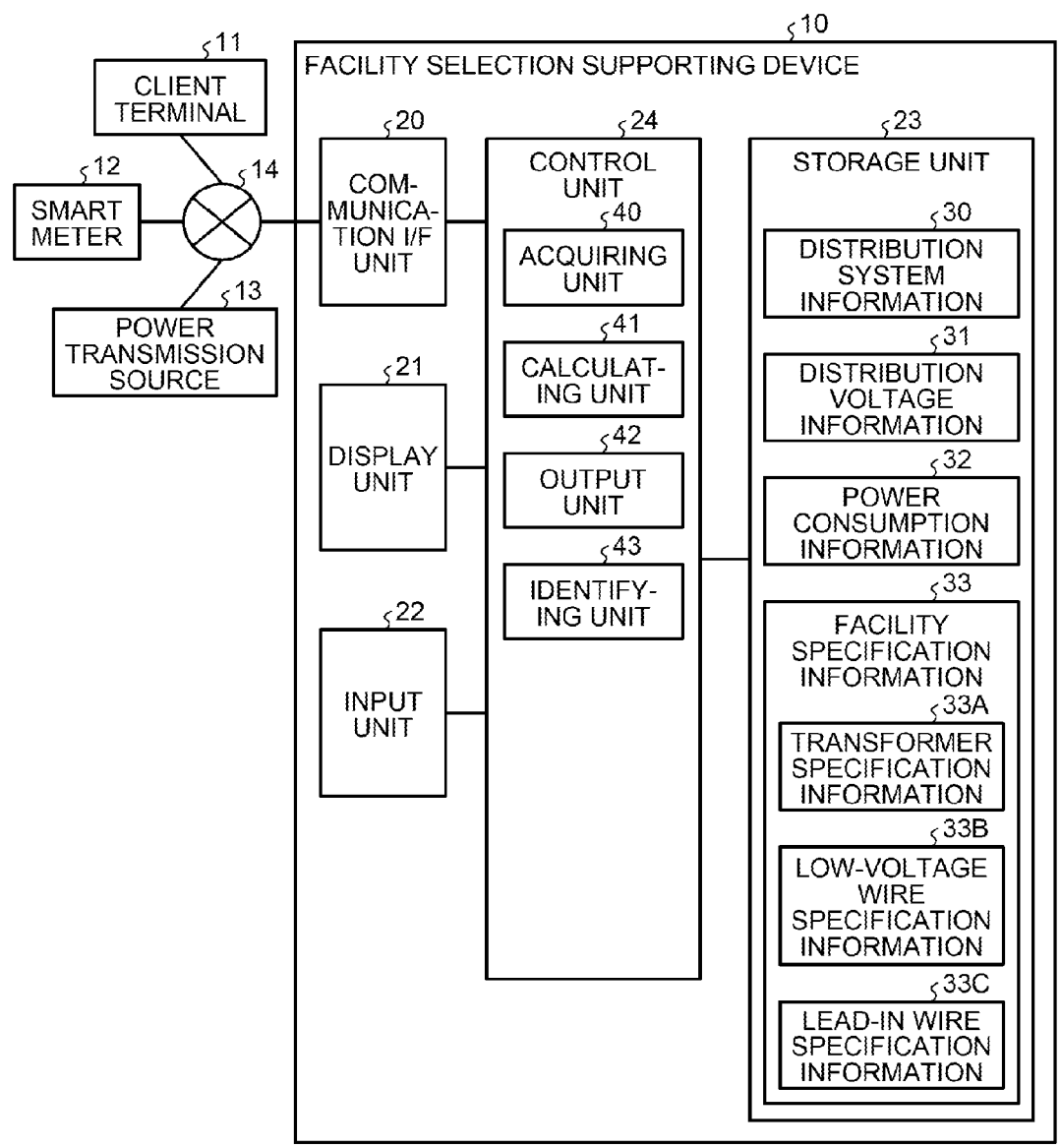
FIG. 16 is a block diagram of the functional configuration of a facility selection supporting device according to a second embodiment of the present invention.

A second embodiment according to the present invention will be described. FIG. 16 is a block diagram of the functional configuration of a facility selection supporting device according to the second embodiment. The configuration of the facility selection supporting device 10 according to the second embodiment is substantially the same as that of the first embodiment. The explanation will be mainly made of the differing parts.

The control unit 24 further includes, as illustrated in FIG. 16, an identifying unit 43.

Distribution facilities generate heat as a current flows and the generated heat increases with a larger current. The temperature of distribution facilities rises with the longer period during which a large current flows. If the temperature of distribution facility exceeds the allowable temperature, the distribution facility is likely to malfunction. The allowable current of distribution facilities is therefore determined to be a temperature not exceeding the allowance if a current flows. Because the distribution facilities are cooled in the period when a small current flows, the temperature thereof hardly rises even when a large current flows through temporarily.

Figure 17:
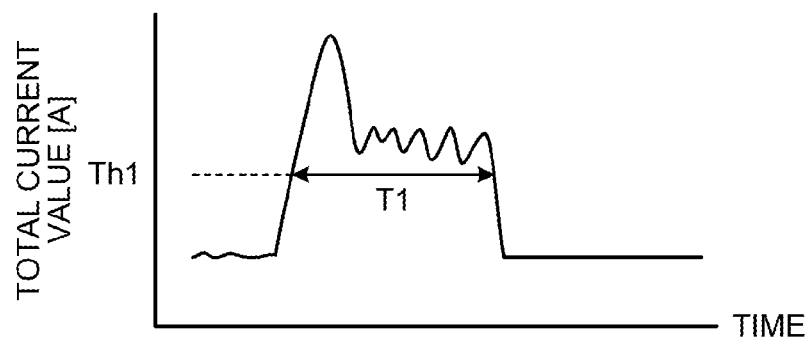
FIG. 17 is an example diagram of a change in a load according to the second embodiment.

The identifying unit 43 performs various types of identification. The identifying unit 43, for example, identifies the section where the absolute values of the total current values are equal to or larger than a certain threshold and the time points, at which the total current values are calculated, consecutively exist. FIG. 17 is an example diagram of a change in a load. The identifying unit 43, for example, identifies the section T1 where the absolute values of the total current values reach a threshold Th1 and the time points, at which the total current values are calculated, consecutively exist, as illustrated in FIG. 17.

If the identified section T1 is equal to or larger than a certain time period, for example, 2 hours or longer, the output unit 42 selects the distribution facility having an allowable current value larger than the total current values calculated at the time points in the section and outputs the distribution facility. That is, the output unit 42 selects the distribution facility having the allowable current value larger than the total current values in the section T1. The output unit 42, for example, selects the distribution facility having the allowable current value corresponding to the resultant of adding a margin to the maximum total current value in the section T1. The margin may be a fixed value or a ratio such as 10% of the maximum total current value. The margin may be externally set by an administrator, for example.

Advantageous Effects of the Second Embodiment

As described above, the facility selection supporting device 10 identifies the section where the absolute values of the total current values are equal to or larger than a threshold Th1 and the time points, at which the total current values are calculated, consecutively exist. If the identified section is equal to or larger than a certain time period the facility selection supporting device 10 outputs the distribution facility having an allowable current value larger than the total current values calculated at the time points in the section. This enables the facility selection supporting device 10 to suppress failures that are likely to be caused by the temperature in the distribution facility exceeding the allowable temperature.

[c] Third Embodiment

A third embodiment according to the present invention will be described. The configuration of the facility selection supporting device 10 according to the third embodiment is substantially the same as that of the second embodiment and overlapped explanation thereof will be omitted.

Figure 18:
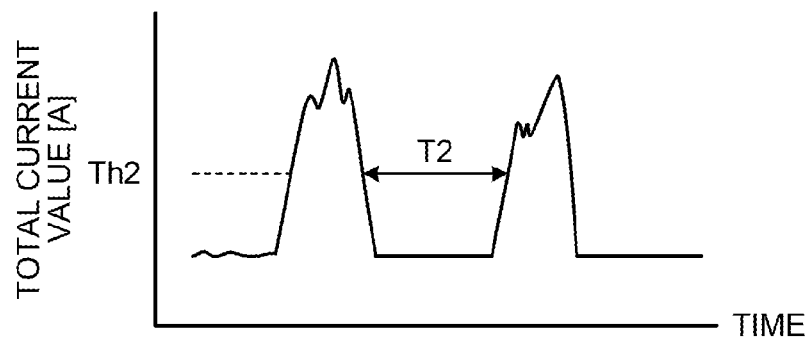
FIG. 18 is an example diagram of a change in a load according to a third embodiment of the present invention.

The identifying unit 43 in the facility selection supporting device 10 according to the third embodiment identifies the interval between the time points when the absolute value of the total current value is equal to or larger than a threshold. FIG. 18 is an example diagram of a change in a load. The identifying unit 43, as illustrated in FIG. 18, identifies the interval T2 between the time points when the absolute value of the total current values are equal to or larger than the threshold Th2.

The distribution facility is cooled in the period when a small current flows. If the interval T2 between the periods when a large flowing current flows is long, the distribution facility is sufficiently cooled in the interval T2. By contrast, if the interval T2 is short, the distribution facility is not sufficiently cooled in the interval T2, thus the temperature of the distribution facility increases.

The output unit 42 therefore outputs the recommended distribution facility as follows if the identified interval T2 is shorter than a certain time period, for example, an hour or shorter. That is, the output unit 42 uses the total current value having the absolute value equal to or larger than the threshold Th2 and the interval T2 between the time points when the total current values are calculated is equal to or smaller than a certain time period to output the recommended distribution facility. If the identified interval T2 is equal to or smaller than a certain time period, the output unit 42 uses the total current value in the section where the absolute values of the total current values are equal to or larger than the threshold Th2 before and after the interval T2 to select the distribution facility. The output unit 42, for example, selects the distribution facility having the allowable current value corresponding to the maximum total current value in the section where the absolute values of the total current values are equal to or larger than the threshold Th2 before and after the interval T2.

Advantageous Effects of the Third Embodiment

As described above, the facility selection supporting device 10 identifies the interval between the time points when the absolute values of the total current values are equal to or larger than a threshold. If any identified interval is equal to or smaller than a certain time period, the facility selection supporting device 10 uses the total current value having the absolute value equal to or larger than a threshold and the identified interval between the time points when the total current values are calculated is equal to or smaller than a certain time period to output the recommended distribution facility. This enables the facility selection supporting device 10 to suppress failures that are likely to be caused by the temperature in the distribution facility exceeding the allowable temperature.

[c] Fourth Embodiment

While the explanations have been made of the embodiments of the disclosed device, the present invention may be embodied as various difference aspects besides the embodiments above. The following describes other embodiments included in the present invention.

In the embodiment described above, the smart meter 12 transmits the current value used by a consumer in each certain period. This is provided merely for exemplary purpose and is not limited to this. If the smart meter 12 does not transmit the current value, the current value used by a consumer may be calculated based on the amount of power consumption and the voltage. If the smart meter 12 is not provided, the current value may be calculated based on the specification of the load facility or the power source facility connected to the distribution system.

In the embodiment described above, the smart meter 12 transmits various types of information to the facility selection supporting device 10 through the network 14. This is also provided merely for exemplary purpose and is not limited to this. The smart meter 12 may store therein the current value in each certain period used by a consumer, and an electric power company may collect the voltage value data at the monthly meter-reading.

In the embodiment described above, the recommended distribution facility is output. This is also provided merely for exemplary purpose and is not limited to this. A different suggestion about replacement of distribution facility in the power supply section may be output based on the magnitude relation between the allowable current value of the distribution facility stored in association with the power supply section and the calculated total current value. Alternatively, a message may be output that prompts an administrator, for example, to replace the distribution facility if the allowable current value of the distribution facility in the distribution system is smaller than the total current value.

Distribution and Integration

The components of each device illustrated in the drawings are not necessarily physically configured as illustrated. In other words, the specific aspects of distribution and integration of each device are not limited to those illustrated in the drawings. The whole or a part of each device may be distributed or integrated functionally or physically in desired units depending on various types of loads and usage, for example. The acquiring unit 40, the calculating unit 41, the output unit 42, and the identifying unit 43 may be connected to the facility selection supporting device 10 as external devices via a network 14, for example. Alternatively, the acquiring unit 40, the calculating unit 41, the output unit 42, and the identifying unit 43 may be included in respective different devices. In this case, the respective devices are connected via a network to cooperate with one another, thereby achieving the functions of the facility selection supporting device 10.

Facility Selection Supporting Program

Figure 19:
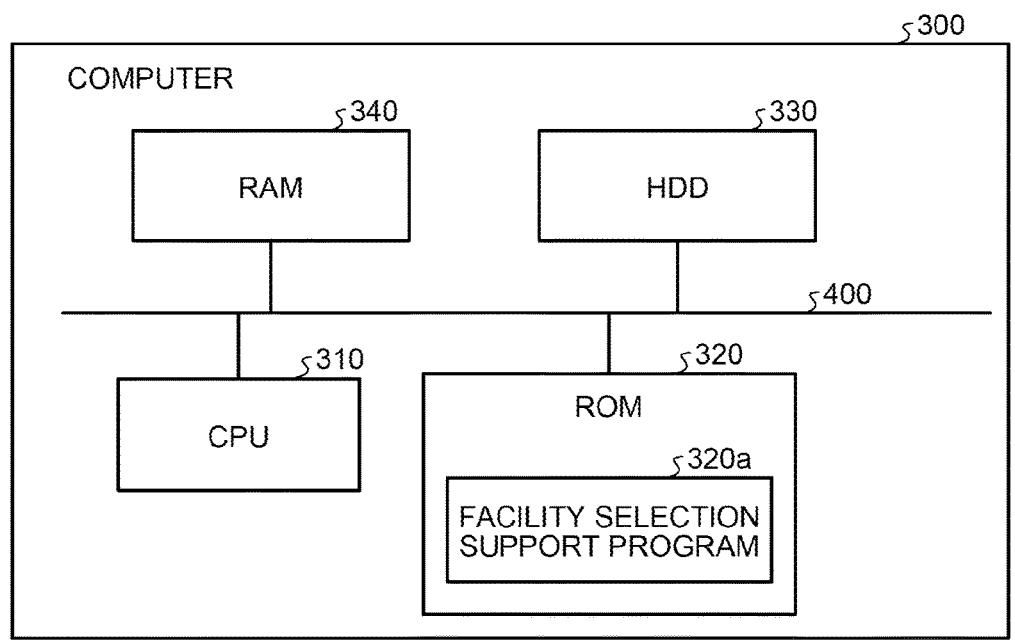
FIG. 19 is an example diagram of a computer that executes a facility selection supporting program according to the embodiments of the present invention.

The various types of processing described in the embodiments can be performed by a computer, such as a personal computer and a workstation, executing a computer program prepared in advance. The following describes an example of a computer that executes a facility selection supporting program having functions similar to those of the embodiments with reference to FIG. 19. FIG. 19 is an example block diagram for explaining the computer that executes the facility selection supporting program.

As illustrated in FIG. 19, a computer 300 includes a central processing unit (CPU) 310, a read only memory (ROM) 320, a hard disk drive (HDD) 330, and a random access memory (RAM) 340. The components 310 to 340 are connected to one another via a bus 400.

The ROM 320 stores therein in advance a facility selection supporting program 320a that functions in the same manner as the processing units in the embodiments described above. The facility selection supporting program 320a functions in the same manner as, for example, the acquiring unit 40, the calculating unit 41, the output unit 42, and the identifying unit 43 in the embodiments described above. The facility selection supporting program 320a may be provided separately as appropriate.

The CPU 310 reads the facility selection supporting program 320a from the ROM 320 and executes the program, thereby performing similar operations as the embodiments described above. That is, the facility selection supporting program 320a performs similar operations as the acquiring unit 40, the calculating unit 41, the output unit 42, and the identifying unit 43.

The ROM 320 need not always store therein in advance the facility selection supporting program 320a. Alternatively, the facility selection supporting program 320a may be stored in the HDD 330.

The computer program may be stored in a "portable physical medium" inserted into the computer 300, such as a flexible disk (FD), a compact disc read only memory (CD-ROM), a digital versatile disc (DVD), a magneto-optical disc, and an integrated circuit (IC) card. The computer 300 may load the computer program from the portable physical medium to execute the computer program.

Furthermore, the computer program may be stored in another computer (or a server) connected to the computer 300 via a public line, the Internet, a local area network (LAN), a wide area network (WAN), or the like. The computer 300 may read each computer program from these devices to execute the computer program.

The present invention can support selection of a distribution facility that matches the electric load.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A non-transitory computer-readable recording medium having stored therein a program for causing a computer to execute a process, the process comprising:
    calculating a total current value of consumers located in and after a certain power supply section on the way from a distribution substation to a particular consumer, the calculated total current value representing a load status of the certain power supply section;
    outputting a recommended distribution facility for the power supply section based on the calculated total current value; and
    selecting the distribution facility having an allowable current value corresponding to a maximum load current value, so that providing of the distribution facility with an excessive capacity is prevented,
    the calculating includes determining whether a forward power flow in which a current flows from a distribution system to the consumer or a reverse power flow in which the current flows from the consumer to the distribution system, and changing a plus or minus sign between the forward power flow and the reverse power flow to calculate the total current value of the consumer.

2. The non-transitory computer-readable recording medium according to claim 1, wherein the recommended distribution facility has the minimum allowable current value, the minimum cost, or the minimum distribution wire diameter out of the distribution facilities having allowable current values exceeding the total current value.

3. The non-transitory computer-readable recording medium according to claim 1, wherein the recommended distribution facility has an allowable current value equal to or larger than the resultant of adding a margin to the total current value.

4. The non-transitory computer-readable recording medium according to claim 1, wherein
    the total current value is calculated at a plurality of time points in respective certain periods, and
    the outputting includes outputting the distribution facility having an allowable current value corresponding to the total current value having the maximum absolute value out of the total current values calculated in the respective certain periods.

5. The non-transitory computer-readable recording medium according to claim 1, wherein
    the total current value is calculated at a plurality of time points in respective certain periods, and
    the process further comprises identifying a section where the absolute values of the total current values are equal to or larger than a threshold and the time points, at which the total current values are calculated, consecutively exist, and
    when the identified section is equal to or larger than a certain time period, the outputting includes outputting a distribution facility having an allowable current value larger than the total current values calculated at the time points in the section.

6. The non-transitory computer-readable recording medium according to claim 1, wherein
    the total current value is calculated at a plurality of time points in respective certain periods, and
    the process further comprises identifying an interval between the time points when the absolute value of the total current value is equal to or larger than a threshold, and
    when the identified interval is equal to or smaller than a certain time period, the outputting includes outputting a recommended distribution facility by using the total current value having an absolute value equal to or larger than a threshold and the identified interval between the time points when the total current values are calculated is equal to or smaller than a certain time period.

7. The non-transitory computer-readable recording medium according to claim 1, wherein the calculating includes summing up current values of the consumers measured time points of which are included in a certain period.

8. The non-transitory computer-readable recording medium according to claim 1, wherein
    the process further includes acquiring current values of power having been used at each consumer who tends to temporarily use the power connected to a distribution system from a distribution substation, and
    the calculating includes calculating a total current value of consumers located in and after a certain power supply section of the distribution system from among the acquired current values of the each consumer.

9. A facility selection supporting method comprising:
    calculating, using a processor, a total current value of consumers located in and after a certain power supply section on the way from a distribution substation to a particular consumer, the calculated total current value representing a load status of the certain power supply section;
    outputting, using the processor, a recommended distribution facility for the power supply section based on the calculated total current value; and
    selecting the distribution facility having an allowable current value corresponding to a maximum load current value, so that providing of the distribution facility with an excessive capacity is prevented,
    the calculating includes determining whether a forward power flow in which a current flows from a distribution system to the consumer or a reverse power flow in which the current flows from the consumer to the distribution system, and changing a plus or minus sign between the forward power flow and the reverse power flow to calculate the total current value of the consumer.

10. A facility selection supporting device comprising:
    a processor; and
    a memory, wherein the processor executes a process comprising:
    calculating a total current value of consumers located in and after a certain power supply section on the way from a distribution substation to a particular consumer, the calculated total current value representing a load status of the certain power supply section;

storing the total current value in the memory; and outputting a recommended distribution facility for the power supply section based on the total current value in the memory; and selecting the distribution facility having an allowable current value corresponding to a maximum load current value, so that providing of the distribution facility with an excessive capacity is prevented, the calculating includes determining whether a forward power flow in which a current flows from a distribution system to the consumer or a reverse power flow in which the current flows from the consumer to the distribution system, and changing a plus or minus sign between the forward power flow and the reverse power flow to calculate the total current value of the consumer.

* * * * *